US012772633B2

(12) United States Patent
Lee et al.

(10) Patent No.: US 12,772,633 B2
(45) Date of Patent: Oct. 20, 2026

(54) DISPLAY DEVICE AND TILED DISPLAY DEVICE INCLUDING THE SAME

(71) Applicant: Samsung Display Co., LTD., Yongin-si (KR)

(72) Inventors: Kye Uk Lee, Seoul (KR); Hyun Joon Kim, Hwaseong-si (KR); Jung Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 862 days.

(21) Appl. No.: 17/965,511

(22) Filed: Oct. 13, 2022

(65) Prior Publication Data

US 2023/0246148 A1 Aug. 3, 2023

(30) Foreign Application Priority Data

Jan. 18, 2022 (KR) ........................ 10-2022-0007345

(51) Int. Cl.

| | |
|---|---|
| ***G06F 3/14*** | (2006.01) |
| ***G09F 9/302*** | (2006.01) |
| ***G09F 9/33*** | (2006.01) |
| ***H10D 89/60*** | (2025.01) |
| ***H10H 20/831*** | (2025.01) |
| ***H10H 20/857*** | (2025.01) |

(52) U.S. Cl.

CPC ......... *H10H 20/857* (2025.01); *G09F 9/3026* (2013.01); *G09F 9/33* (2013.01); *H10D 89/911* (2025.01); *H10H 20/8312* (2025.01)

(58) Field of Classification Search

CPC ......................... G09G 2300/02; H10H 20/857

See application file for complete search history.

(56) References Cited

U.S. PATENT DOCUMENTS

| | | | | |
|---|---|---|---|---|
| 11,328,629 B2 | 5/2022 | Lee et al. | | |
| 2008/0123004 A1* | 5/2008 | Lin | ...................... | H10D 89/931 349/40 |
| 2009/0296011 A1 | 12/2009 | Yoon et al. | | |
| 2010/0238094 A1* | 9/2010 | Cho | ..................... | G09G 3/3208 345/82 |

(Continued)

FOREIGN PATENT DOCUMENTS

| | | |
|---|---|---|
| KR | 10-2016-0133082 A | 11/2016 |
| KR | 10-2019-0113535 A | 10/2019 |

(Continued)

OTHER PUBLICATIONS

Korean Office Action issued in corresponding KR Application No. 10-2022-0007345, dated Apr. 25, 2025, 11 pages.

*Primary Examiner* — William Boddie
*Assistant Examiner* — Andrew B Schnirel
(74) *Attorney, Agent, or Firm* — Womble Bond Dickinson (US) LLP

(57) ABSTRACT

A display device includes a substrate including a display area including pixels, and a non-display area around the display area, a pad part in the non-display area, antistatic circuits between the pad part and the pixels, respectively, a first resistance line connected to the pad part and to the antistatic circuits, a second resistance line connected to the first resistance line and overlapping the first resistance line, and a fan-out line connected between the second resistance line and a respective one of the pixels.

20 Claims, 11 Drawing Sheets

(56) References Cited

U.S. PATENT DOCUMENTS

| | | | | |
|---|---|---|---|---|
| 2017/0162105 | A1* | 6/2017 | Kim | H10D 1/47 |
| 2019/0304386 | A1* | 10/2019 | Kim | G09G 3/30 |
| 2020/0312882 | A1 | 10/2020 | Son | |
| 2020/0343326 | A1 | 10/2020 | Park et al. | |
| 2021/0202676 | A1 | 7/2021 | Jeong et al. | |
| 2021/0217353 | A1 | 7/2021 | Zhao et al. | |
| 2023/0082959 | A1 | 3/2023 | Jeong et al. | |

FOREIGN PATENT DOCUMENTS

| | | | |
|---|---|---|---|
| KR | 10-2020-0048797 | A | 5/2020 |
| KR | 10-2020-0145955 | A | 12/2020 |
| KR | 10-2021-0012391 | A | 2/2021 |

* cited by examiner

DISPLAY DEVICE AND TILED DISPLAY DEVICE INCLUDING THE SAME

CROSS-REFERENCE TO RELATED APPLICATION

This application claims priority to, and the benefit of, Korean Patent Application No. 10-2022-0007345 filed on Jan. 18, 2022 in the Korean Intellectual Property Office, the contents of which in its entirety are herein incorporated by reference.

BACKGROUND

1. Field

The present disclosure relates to a display device, and to a tiled display device including the same.

2. Description of the Related Art

As the information society develops, the demand for display devices for displaying images has increased and diversified. For example, display devices have been applied to various electronic devices, such as smartphones, digital cameras, laptop computers, navigation devices, and smart televisions. The display devices may be flat panel display devices, such as liquid crystal display devices, field emission display devices, or organic light emitting display devices. Among such flat panel display devices, a light emitting display device may display an image without a backlight unit providing light to a display panel because each of pixels of the display panel includes light emitting elements that may emit light by themselves.

When the display device is manufactured in a large size, a defective rate of the light emitting elements may increase due to an increase in the number of pixels, and productivity or reliability may decrease. To solve such a problem, a tiled display device may realize a screen having a large size by connecting a plurality of display devices having a relatively small size to each other. The tiled display device may include boundary portions called seams between the plurality of display devices due to non-display areas or bezel areas of each of the plurality of display devices adjacent to each other. When one image is displayed on the entire screen, the boundary portions between the plurality of display devices give a sense of discontinuity to the entire screen to decrease a degree of immersion of the image.

SUMMARY

Aspects of the present disclosure provide a display device capable of decreasing an arrangement area or a design area of antistatic circuits in a display area, and capable of securing an arrangement area and a design area of pixels, and provide a tiled display device including the same.

Aspects of the present disclosure also provide a display device capable of removing a sense of discontinuity between a plurality of display devices, and capable of improving a degree of immersion of an image by reducing or preventing the likelihood of boundary portions between or non-display areas of the plurality of display devices being recognized, and also provide a tiled display device including the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the disclosure, a display device includes a substrate including a display area including pixels, and a non-display area around the display area, a pad part in the non-display area, antistatic circuits between the pad part and the pixels, respectively, a first resistance line connected to the pad part and to the antistatic circuits, a second resistance line connected to the first resistance line and overlapping the first resistance line, and a fan-out line connected between the second resistance line and a respective one of the pixels.

At least a portion of the second resistance line may overlap a respective one of the antistatic circuits.

The first resistance line may extend while being bent multiple times between the antistatic circuits.

The second resistance line may extend while being bent multiple times between the antistatic circuits, wherein the second resistance line crosses the first resistance line in plan view.

The fan-out line may overlap a respective one of the pixels at one edge of the display area.

The display device may further include a gate high voltage line and a gate low voltage line extending in a first direction, and located between the pad part and the second resistance line.

The gate high voltage line and the gate low voltage line may be between the pad part and the antistatic circuits.

Some of the antistatic circuits may be connected between the gate high voltage line and the first resistance line, wherein others of the antistatic circuits are connected between the first resistance line and the gate low voltage line.

A length of the fan-out line may be inversely proportional to a length of a corresponding one of the first or second resistance line.

Each of the pixels may include a first capacitor including a first capacitor electrode at a first gate layer and a second capacitor electrode at a second gate layer above the first gate layer, wherein the first resistance line is at the first gate layer, and wherein the second resistance line is at the second gate layer.

Each of the pixels may include a thin film transistor including a channel at an active layer, and a gate electrode at a first gate layer above the active layer, wherein the first resistance line is at a same layer as the first capacitor electrode, and wherein the second resistance line is at a layer below the active layer.

The display device may further include a flexible film below the substrate and overlapping the display area, a first lead line extending from the pad part to an edge of the substrate, a side connection line connected to the first lead line and on a side surface of the substrate, and a second lead line below the substrate and connected between the side connection line and the flexible film.

The display device may further include a low potential line in the display area on the substrate, and antistatic layers on an edge of an upper surface of the substrate, and electrically connected to the low potential line.

The first lead line and the pad part may be between the antistatic layers.

According to one or more embodiments of the disclosure, a display device includes a substrate including a display area including pixels, and a non-display area around the display area, a pad part in the non-display area, antistatic circuits at an active layer above the substrate, a first gate layer above the active layer, a first resistance line at the first gate layer, and connected to the pad part and the antistatic circuits, a second resistance line connected to the first resistance line, and at a second gate layer above the first gate layer to overlap the first resistance line, and a fan-out line at the first gate layer and connected to the second resistance line.

The display device may further include a connection electrode above a source metal layer above the second gate layer, and having a first end connected to the first resistance line, and a second end connected to the second resistance line.

The connection electrode may be connected to a first electrode or a second electrode of a respective one of the antistatic circuits.

The first resistance line may be bent multiple times between the antistatic circuits.

The second resistance line may be bent multiple times between the antistatic circuits, and may cross the first resistance line in plan view.

According to one or more embodiments of the disclosure, a tiled display device includes a substrate including a display area including pixels for displaying an image, and a non-display area around the display area, a pad part in the non-display area, antistatic circuits between the pad part and the pixels, a first resistance line connected to the pad part and the antistatic circuits, a second resistance line connected to the first resistance line and overlapping the first resistance line, and a fan-out line connected between the second resistance line and the pixels, and a coupling area between the display devices.

With the display device and the tiled display device including the same according to embodiments, the display device includes the first resistance line located between the plurality of antistatic circuits and electrically connected between the pad part and the fan-out line and the second resistance line connected to the first resistance line in series and overlapping the first resistance line, and thus, may decrease an arrangement area or a design area of the antistatic circuits and secure an arrangement area or a design area of the pixels.

With the display device and the tiled display device including the same according to embodiments, an interval between a plurality of display devices may be reduced or minimized to reduce or prevent visibility of coupling areas between the plurality of display devices, and to remove a sense of discontinuity between the plurality of display devices, thereby improving a degree of immersion of an image.

The aspects of the present disclosure are not limited to the aforementioned aspects, and various other aspects are included in the present specification.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
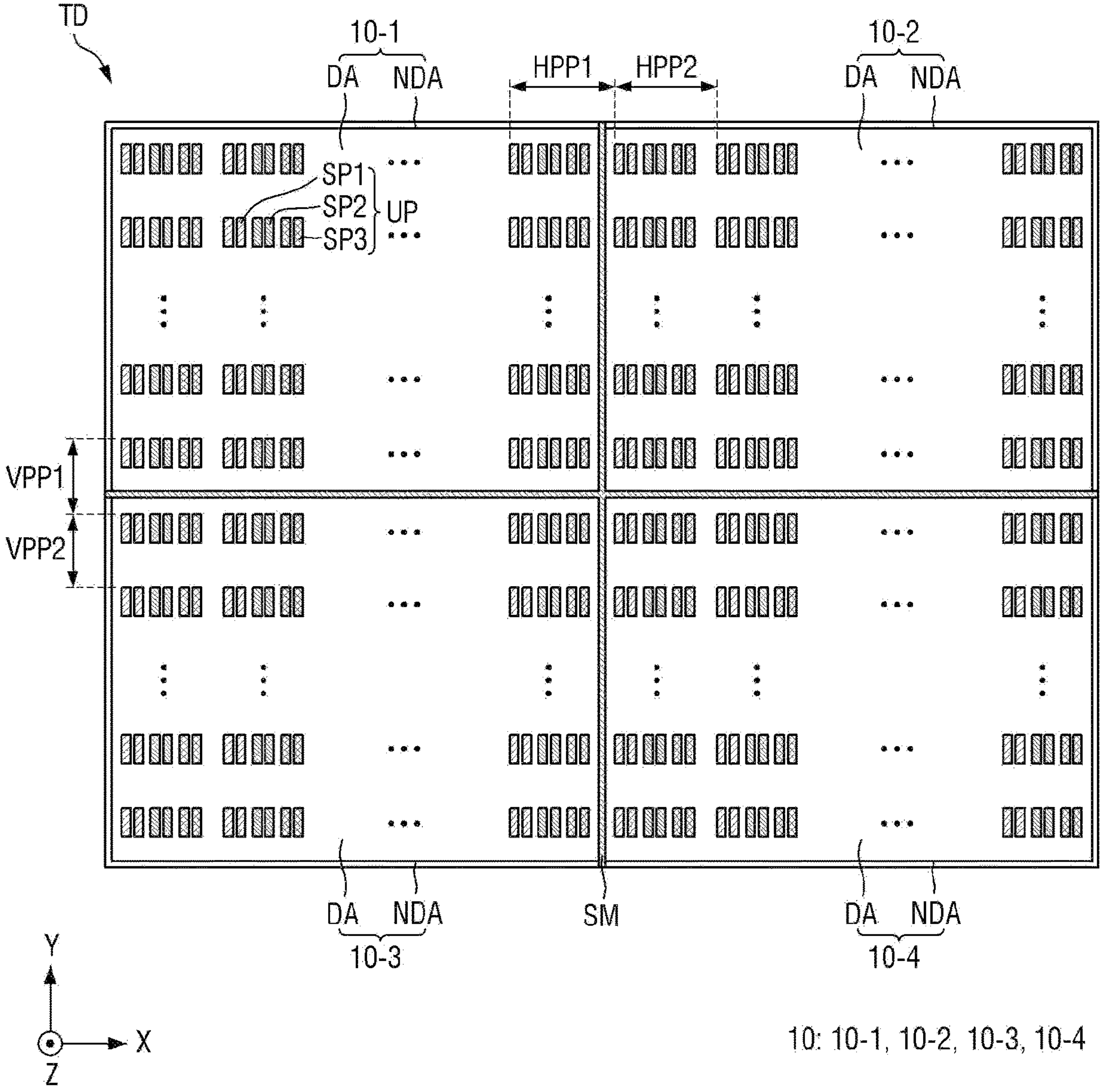
FIG. 1 is a plan view illustrating a tiled display device according to one or more embodiments.

In the following description, for the purposes of explanation, numerous specific details are set forth to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of one or more embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When one or more embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the present disclosure will be described with reference to the accompanying drawings.

FIG. 1 is a plan view illustrating a tiled display device according to one or more embodiments.

Referring to FIG. 1, a tiled display device TD may include a plurality of display devices 10. The plurality of display devices 10 may be arranged in a lattice shape, but are not limited thereto. The plurality of display devices 10 may be connected to each other in a first direction (X-axis direction) or a second direction (Y-axis direction), and the tiled display device TD may have a corresponding shape. As an example, the plurality of display devices 10 may have the same size, but are not limited thereto. As another example, the plurality of display devices 10 may have different sizes.

The tiled display device TD may include first to fourth display devices 10-1 to 10-4. The number of display devices 10 and a coupling relationship between the display devices 10 are not limited to those of one or more embodiments of FIG. 1. The number of display devices 10 may be determined according to sizes of each of the display devices 10 and the tiled display device TD.

Each of the plurality of display devices 10 may have a rectangular shape including long sides and short sides. The plurality of display devices 10 may be located with long sides or short sides connected to each other. Some display devices 10 may be located at edges of the tiled display device TD, and may form one side of the tiled display device TD. Some other display devices 10 may be located at corners of the tiled display device TD, and may form two adjacent sides of the tiled display device TD. Some other display devices 10 may be located inside the tiled display device TD, and may be surrounded by the other display devices 10.

Each of the plurality of display devices 10 may include a display area DA and a non-display area NDA. The display area DA may include a plurality of unit pixels UP to display an image. Each of the plurality of unit pixels UP may include first to third pixels SP1, SP2, and SP3. Each of the first to third pixels SP1, SP2, and SP3 may include an organic light emitting diode including an organic light emitting layer, a quantum dot light emitting diode including a quantum dot light emitting layer, an inorganic light emitting diode including an inorganic semiconductor, or a micro light emitting diode. Hereinafter, it has been mainly described that each of the first to third pixels SP1, SP2, and SP3 includes a micro light emitting diode, but the present disclosure is not limited thereto. The non-display area NDA may be located around the display area DA to surround the display area DA, and may not display an image.

The display device 10 may include the plurality of unit pixels UP arranged along a plurality of rows and columns in the display area DA. The unit pixel UP may include the first to third pixels SP1, SP2, and SP3. Each of the first to third pixels SP1, SP2, and SP3 may include an emission area or may define an opening area defined by a pixel defining film or a bank, and may emit light having a peak wavelength (e.g., predetermined peak wavelength) through the emission area or the opening area. The emission area may be an area in which light generated by a light emitting element of the display device 10 is emitted to the outside of the display device 10. The first pixel SP1 may emit light of a first color, the second pixel SP2 may emit light of a second color, and the third pixel SP3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the present disclosure is not limited thereto.

The first to third pixels SP1, SP2, and SP3 may be sequentially and repeatedly located along the first direction (X-axis direction) of the display area DA. As an example, areas of the emission areas of the first to third pixels SP1, SP2, and SP3 may be substantially the same as each other. As another example, areas of the emission areas of the first to third pixels SP1, SP2, and SP3 may be different from each other, but are not limited thereto.

The tiled display device TD may have an overall planar shape, but is not limited thereto. The tiled display device TD may have a three-dimensional shape to provide a three-dimensional effect to a user. As an example, when the tiled display device TD has the three-dimensional shape, at least some of the plurality of display devices 10 may have a curved shape. As another example, the plurality of display devices 10 have a planar shape and are connected to each other at an angle (e.g., predetermined angle), such that the tiled display device TD may have a three-dimensional shape.

The tiled display device TD may include coupling areas SM located between the plurality of display areas DA. The tiled display device TD may be formed by connecting the non-display areas NDA of each of adjacent display devices 10 to each other. The plurality of display devices 10 may be connected to each other through coupling members or adhesive members located in the coupling areas SM. The coupling areas SM of each of the plurality of display devices 10 may omit pad parts or flexible films attached to the pad parts. A distance between the display areas DA of each of the plurality of display devices 10 may be too small for the coupling areas SM between the plurality of display devices 10 to be recognized by the user. For example, a first horizontal pixel pitch HPP1 between pixels of the first display device 10-1 and pixels of the second display device 10-2 may be substantially the same as a second horizontal pixel pitch HPP2 between respective pixels of the second display device 10-2. A first vertical pixel pitch VPP1 between pixels of the first display device 10-1 and pixels of the third display device 10-3 may be substantially the same as a second vertical pixel pitch VPP2 between respective pixels of the third display device 10-3. Accordingly, the tiled display device TD may remove a sense of discontinuity between the plurality of display devices 10 and may improve a degree of immersion of an image by reducing or preventing visibility of the coupling areas SM between the plurality of display devices 10.

Figure 2:
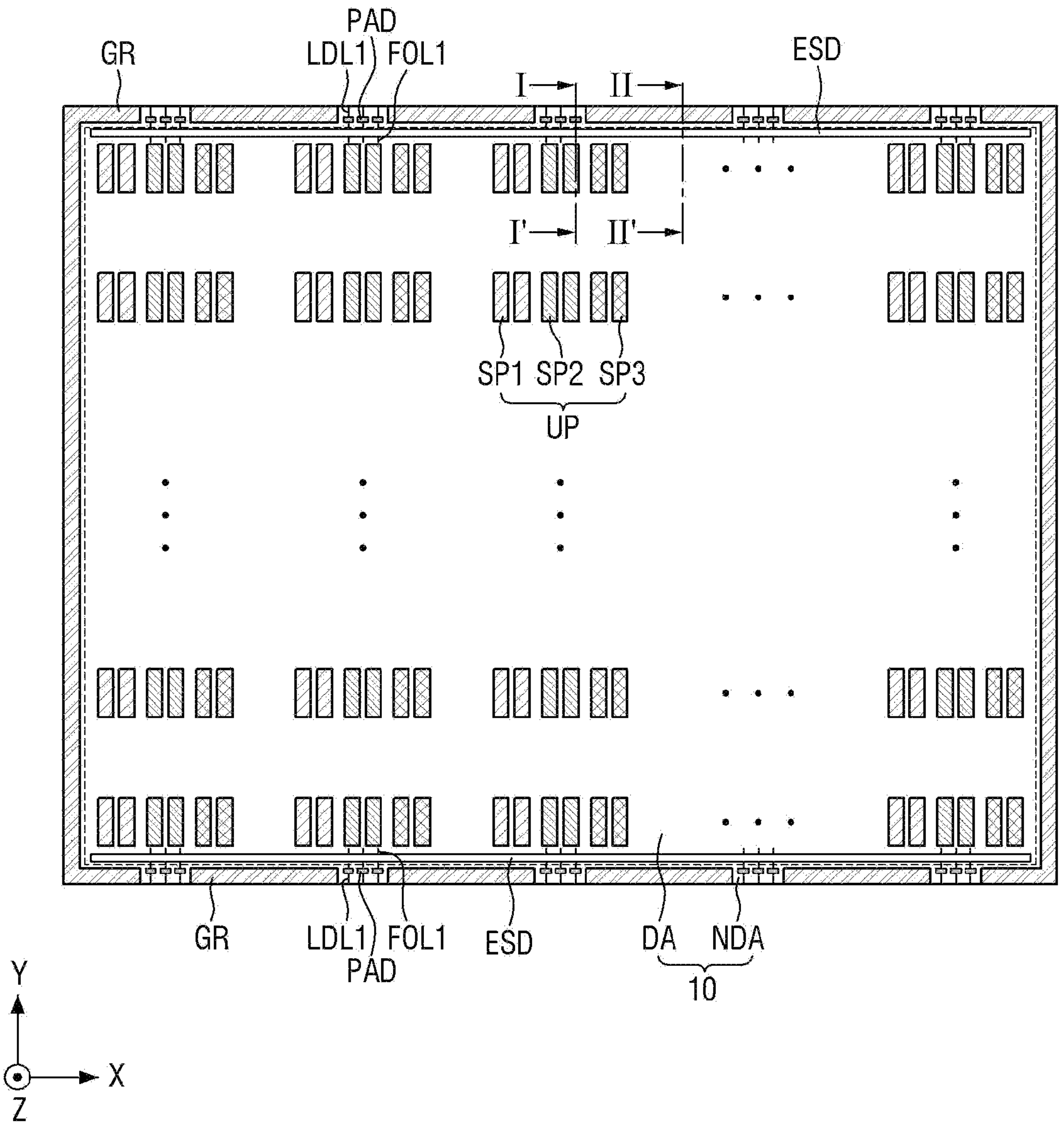
FIG. 2 is a plan view illustrating a display device according to one or more embodiments.

FIG. 2 is a plan view illustrating a display device according to one or more embodiments.

Referring to FIG. 2, the display device 10 may include a display area DA and a non-display area NDA. The display area DA may include unit pixels UP, antistatic circuits ESD, and first fan-out lines FOL1.

The plurality of unit pixels UP may be arranged to have a uniform pixel pitch. The plurality of unit pixels UP may be arranged along pixel rows and pixel columns. The unit pixel UP may include first to third pixels SP1, SP2, and SP3. Each of the first to third pixels SP1, SP2, and SP3 of FIG. 2 may correspond to at least one light emitting element exposed by the opening area. As an example, each of the first to third pixels SP1, SP2, and SP3 may include as many as two light emitting elements or more. In this case, each of the first to third pixels SP1, SP2, and SP3 may include a main light emitting element and a repair light emitting element, but is not limited thereto. As another example, each of the first to third pixels SP1, SP2, and SP3 may include three or more light emitting elements. Accordingly, the first to third pixels SP1, SP2, and SP3 may emit light corresponding to gradations of the corresponding pixels.

The antistatic circuits ESD may be located at both side edges or upper and lower edges of the display area DA, but are not limited thereto. The antistatic circuits ESD may be located adjacent to the first fan-out lines FOL1 electrically connected to flexible films. For example, when the first fan-out lines FOL1 are located at the upper and lower edges of the display area DA, the antistatic circuits ESD may be located at the upper and lower edges of the display area DA. The antistatic circuits ESD may eliminate static electricity introduced from the outside to reduce or prevent the likelihood of static electricity being introduced into the display area DA through the first fan-out lines FOL1.

The first fan-out lines FOL1 may extend from the antistatic circuits ESD to the display area DA. The first fan-out lines FOL1 may be located at the upper and lower edges of the display area DA, but are not limited thereto. The first fan-out lines FOL1 may overlap the unit pixels UP located on the upper edge or the lower edge of the display area DA.

The first fan-out lines FOL1 may be electrically connected to the flexible films through first lead lines LDL1, side connection lines, and second lead lines. The first fan-out lines FOL1 may supply voltages or signals received from the first lead lines LDL1 to the display area DA. For example, the first fan-out lines FOL1 may be electrically connected to data lines, clock lines, or power lines located in the display area DA. Here, the power lines may be driving voltage lines, low potential lines, initialization voltage lines, reference voltage lines, gate high voltage lines, or gate low voltage lines, but are not limited thereto. The non-display area NDA may include the first lead lines LDL1, pad parts PAD, and antistatic layers GR.

The first lead lines LDL1 may be located at edges of the non-display area NDA. The first lead lines LDL1 may be located at upper and lower edges of the non-display area NDA, but are not limited thereto. The first lead lines LDL1 may be located between respective ones of the antistatic layers GR. The first lead lines LDL1 might not overlap the antistatic layers GR in a third direction (e.g., Z-axis direction or thickness direction). The first lead lines LDL1 may be electrically connected to the flexible films through side connection lines located on side surfaces of the display device 10 and through second lead lines located on a lower portion of the display device 10. The first lead lines LDL1 may supply voltages or signals received from the flexible films to the pad parts PAD and to the first fan-out lines FOL1.

The pad parts PAD may be located at the edges of the non-display area NDA. The pad parts PAD may be located at the upper and lower edges of the non-display area NDA, but are not limited thereto. The pad parts PAD may be located between respective ones of the antistatic layers GR. The pad parts PAD might not overlap the antistatic layers GR in the third direction (e.g., Z-axis direction or thickness direction). The pad parts PAD may be electrically connected to the flexible films through the first lead lines LDL1, the side connection lines, and the second lead lines. For example, the pad parts PAD may be test pads receiving test signals, but are not limited thereto.

The antistatic layers GR may be located at edges of an upper surface of the display device 10 or edges of an upper portion of a substrate to surround the display area DA. The antistatic layers GR may be located at a portion of an upper edge of, at a portion of a lower edge of, at a left edge of, and at a right edge of the non-display area NDA. The antistatic layers GR might not be located on portions of the upper and lower edges of the non-display area NDA, and thus, might not overlap the first lead lines LDL1 and the pad parts PAD in the third direction (e.g., Z-axis direction or thickness direction). The antistatic layers GR may be guard rings capable of reducing or preventing static electricity, but are not limited thereto. The antistatic layers GR may be electrically connected to a low potential line or to a common voltage line to suitably discharge static electricity. Here, the low potential line or the common voltage line may receive a low potential voltage or a common voltage. The antistatic layers GR may be located at the edges of the upper surface of the display device 10, and may potentially eliminate static electricity introduced in a cutting process or a grinding process of the display device 10 to reduce or prevent the likelihood of electricity being introduced into the display area DA. The antistatic layers GR may relatively rapidly discharge static electricity introduced from the outside of the display device 10.

As an example, the antistatic layer GR may include a transparent conductive material (TCO), such as indium tin oxide (ITO), indium zinc oxide (IZO), or indium tin zinc oxide (ITZO). As another example, the antistatic layer GR may have a stacked structure, such as ITO/Ag/ITO/, ITO/Ag/IZO, or ITO/Ag/ITZO/IZO. As still another example, the antistatic layer GR may include at least one of molybdenum (Mo), aluminum (Al), chromium (Cr), gold (Au), titanium (Ti), nickel (Ni), neodymium (Nd), and copper (Cu).

Figure 3:
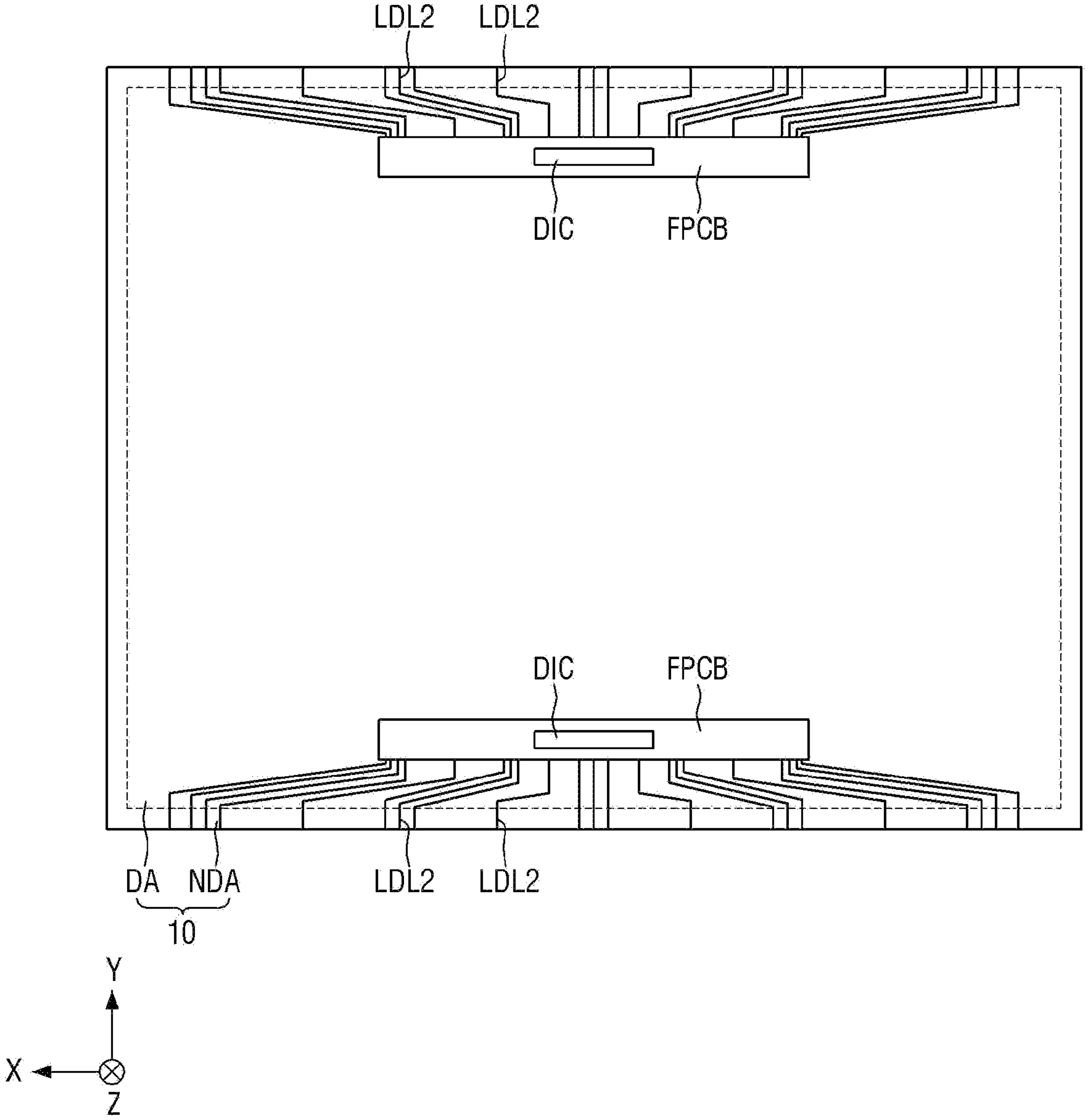
FIG. 3 is a bottom view illustrating the display device according to one or more embodiments.

FIG. 3 is a bottom view illustrating the display device according to one or more embodiments.

Referring to FIG. 3, the display device 10 may include a display area DA and non-display areas NDA. The display area DA may include flexible films FPCB, display drivers DIC, and second lead lines LDL2.

The flexible films FPCB may be located on a lower surface of the display device 10. The flexible films FPCB may be attached to the lower surface of the display device 10 through an adhesive member or an anisotropic conductive film. The flexible films FPCB may supply voltages or signals to the first fan-out lines FOL1 located on the upper portion of the substrate through the second lead lines LDL2, through the side connection lines, and through the first lead lines LDL1. For example, the flexible film FPCB located on the upper side of the display area DA may supply voltages or signals to the first fan-out lines FOL1 on the upper side of the display area DA, and the flexible film FPCB located on the lower side of the display area DA may supply voltages or signals to the first fan-out lines FOL1 located on the lower side of the display area DA. The flexible films FPCB may transmit signals of the display drivers DIC to the display device 10.

The display drivers DIC may output signals and voltages for driving the first to third pixels SP1, SP2, and SP3. The display drivers DIC may supply data voltages to the data lines. The data voltages may be supplied to the first to third pixels SP1, SP2, and SP3, and may determine luminance of the first to third pixels SP1, SP2, and SP3. The display drivers DIC may supply source voltages to power lines, and may supply clock signals to a gate driver. For example, the display driver DIC may be formed of an integrated circuit (IC), and may be mounted on the flexible film FPCB in a chip-on-film manner or a tape carrier package manner, but is not limited thereto.

The second lead lines LDL2 may extend from the flexible films FPCB located in the display area DA to edges of the non-display area NDA. The second lead lines LDL2 may be located on upper and lower edges of the lower surface of the display device 10, but are not limited thereto. The second lead lines LDL2 may supply the voltages or the signals received from the flexible films FPCB to the first fan-out lines FOL1 through the side connection lines and the first lead lines LDL1. For example, the second lead lines LDL2 located on the upper side of the display area DA may be electrically connected to the first fan-out lines FOL1 on the upper side of the display area DA, and the second lead lines LDL2 located on the lower side of the display area DA may be electrically connected to the first fan-out lines FOL1 located on the lower side of the display area DA.

In the display device 10, the flexible films FPCB and the display drivers DIC are located on the lower surface of the display device 10, and thus, might not be located in the coupling areas SM of the tiled display device TD. Accordingly, the non-display area NDA of the display device 10 may be reduced or minimized, and a pixel pitch between adjacent display devices 10 may be designed to be the same as a pixel pitch in the display device 10. The display device 10 includes the antistatic layers GR, and may thus eliminate static electricity introduced from the outside of the display device 10 to reduce or prevent damage to a thin film transistor layer and a light-emitting-element layer.

Figure 4:
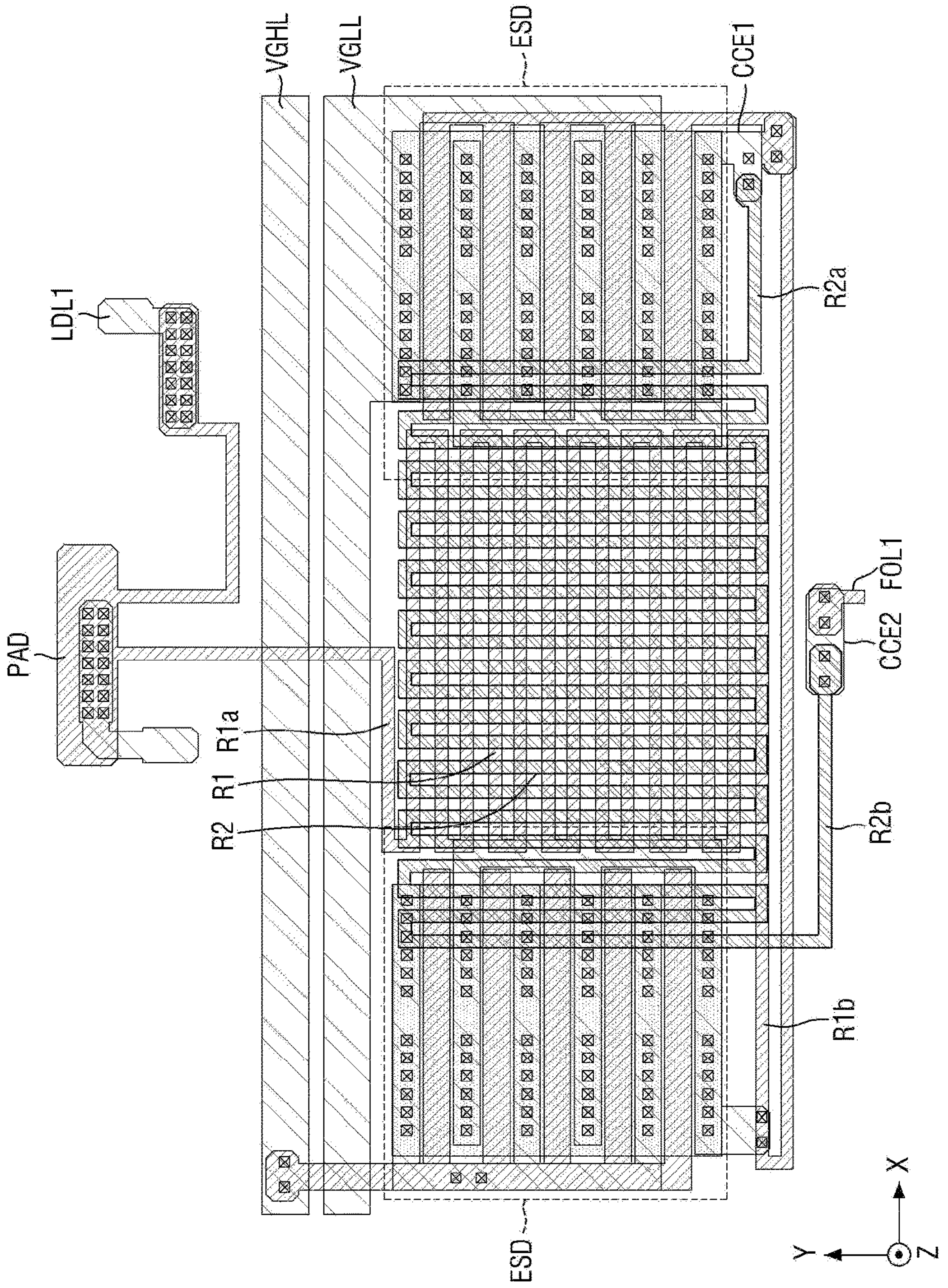
FIG. 4 is a view illustrating antistatic circuits and first and second resistance lines in the display device according to one or more embodiments.
Figure 5:
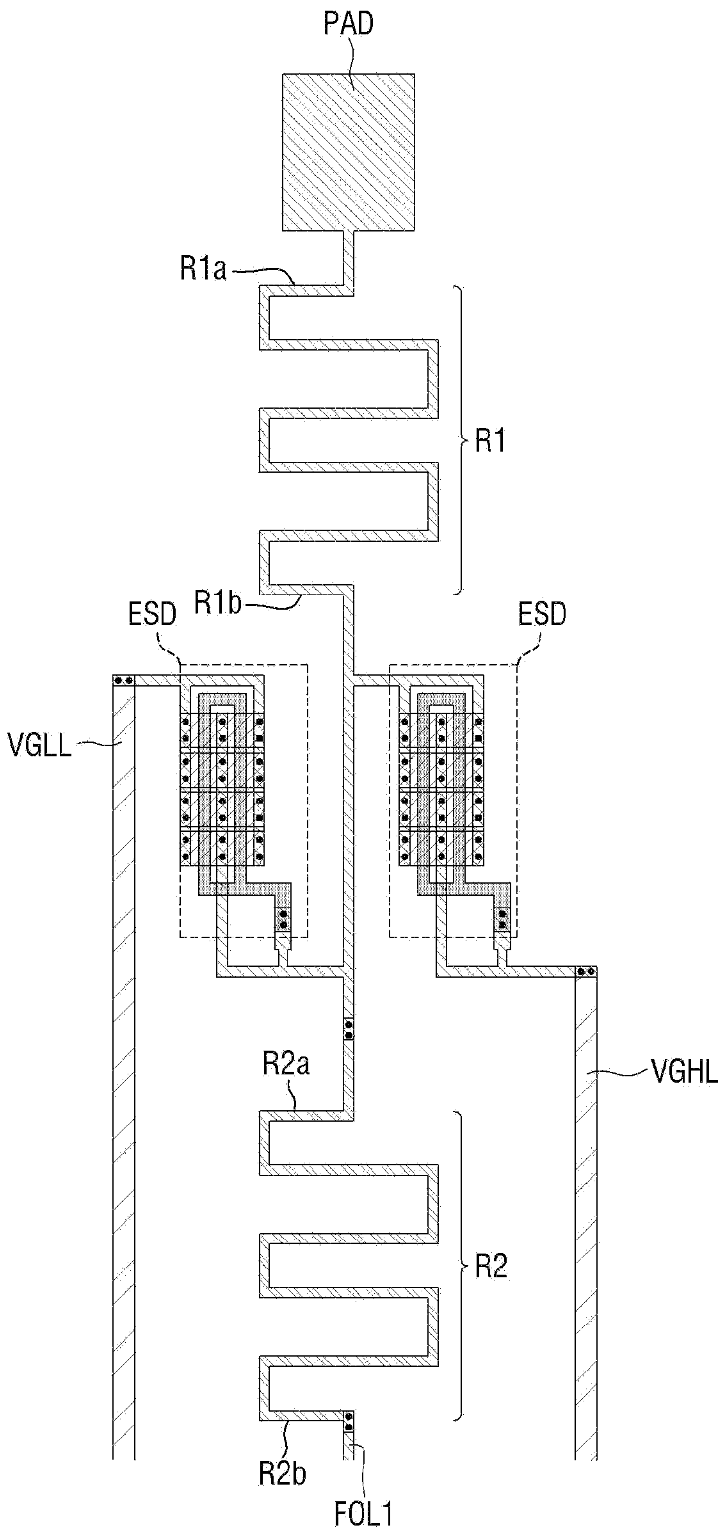
FIG. 5 is a schematic view illustrating the antistatic circuits and the first and second resistance lines of FIG. 4.

FIG. 4 is a view illustrating antistatic circuits and first and second resistance lines in the display device according to one or more embodiments, and FIG. 5 is a schematic view illustrating the antistatic circuits and the first and second resistance lines of FIG. 4. FIG. 5 may be a schematic view illustrating first and second resistance lines R1 and R2 of FIG. 4. Accordingly, an arrangement relationship of the first and second resistance lines R1 and R2 may correspond to a configuration illustrated in FIG. 4.

Referring to FIGS. 4 and 5, the display device 10 may include a pad part PAD, a first resistance line R1, a second resistance line R2, antistatic circuits ESD, and a first fan-out line FOL1.

One end R1*a* of the first resistance line R1 may be connected to the pad part PAD, and the first resistance line R1 may extend in a zigzag fashion between a plurality of antistatic circuits ESD. The first resistance line R1 may extend while being bent multiple times in the first direction (X-axis direction) and the second direction (Y-axis direction). The other end R1*b* of the first resistance line R1 may be connected to the plurality of antistatic circuits ESD and the second resistance line R2. In FIG. 4, the other end R1*b* of the first resistance line R1 may be sequentially connected to a left antistatic circuit ESD, a right antistatic circuit ESD, and one end R2*a* of the second resistance line R2, but is not limited thereto.

One end R2*a* of the second resistance line R2 may be electrically connected to the right antistatic circuit ESD and to the other end R1*b* of the first resistance line R1 through a first connection electrode CCE1. The first connection electrode CCE1 may be connected to a first electrode or a second electrode of the antistatic circuit ESD. The second resistance line R2 may extend in a zigzag fashion between the plurality of antistatic circuits ESD. The second resistance line R2 may extend while being bent multiple times in the first direction (X-axis direction) and in the second direction (Y-axis direction). The other end R2*b* of the second resistance line R2 may be electrically connected to the first fan-out line FOL1 through a second connection electrode CCE2.

The first and second resistance lines R1 and R2 may be located between the plurality of antistatic circuits ESD. At least portions of the second resistance line R2 may overlap the plurality of antistatic circuits ESD. The first and second resistance lines R1 and R2 may be connected to each other in series. The first and second resistance lines R1 and R2 may overlap each other in the third direction (Z-axis direction) or in the thickness direction. The first and second resistance lines R1 and R2 may completely overlap or partially overlap each other between the plurality of antistatic circuits ESD. The first and second resistance lines R1 and R2 may cross each other at least once in plan view, but may be insulated from each other. Because the first and second resistance lines R1 and R2 correspond to one line for electrically connecting the pad part PAD and the first fan-out line FOL1 to each other, the display device 10 may be normally driven even though a short-circuit occurs between the first and second resistance lines R1 and R2.

The first and second resistance lines R1 and R2 may be located at different metal layers. As an example, the first resistance line R1 may be located at a first gate layer, and the second resistance line R2 may be located at a second gate layer, but the present disclosure is not limited thereto. As another example, the first resistance line R1 may be located at a first gate layer, and the second resistance line R2 may be located at a light-blocking layer. Each of the first and second resistance lines R1 and R2 may be formed in a zigzag pattern. A length of each of the first and second resistance lines R1 and R2 may be designed differently depending on a position of the first fan-out line FOL1. Accordingly, the sum of lengths of the first and second resistance lines R1 and R2 and the first fan-out line FOL1 of the display device 10 may be substantially the same regardless of the position of the first fan-out line FOL1, and thus, the first and second resistance lines R1 and R2 and the first fan-out lines FOL1 may have substantially the same resistance value.

The display device 10 includes the first and second resistance lines R1 and R2 connected to each other in series and overlapping each other in the thickness direction, and thus, may decrease an arrangement area or a design area of the antistatic circuits ESD in the display area DA. The display device 10 includes the first and second resistance lines R1 and R2, and thus, may decrease an area between the pad part PAD and the first fan-out line FOL1. Accordingly, the display device 10 may secure an arrangement area or a design area of a plurality of pixels in the display area DA, and may reduce or minimize an area of the non-display area NDA.

The antistatic circuits ESD may be located adjacent to the first fan-out line FOL1. Some of the antistatic circuits ESD may be connected between a gate high voltage line VGHL and the first resistance line R1. Some antistatic circuits ESD may be transistors each including a first electrode connected to the gate high voltage line VGHL, a gate electrode connected to the gate high voltage line VGHL, and a second electrode connected to the first resistance line R1, and may operate as diodes. Here, one of the first and second electrodes may be a drain electrode, and the other of the first and second electrodes may be a source electrode.

Some others of the antistatic circuits ESD may be connected between the first resistance line R1 and a gate low voltage line VGLL. Some other antistatic circuits ESD may be transistors, each including a first electrode connected to the first resistance line R1, a gate electrode connected to the first resistance line R1, and a second electrode connected to the gate low voltage line VGLL, and may operate as diodes. Therefore, the antistatic circuits ESD may practically eliminate static electricity introduced from the outside to reduce or prevent the likelihood of static electricity being introduced into the display area DA through the first fan-out line FOL1.

The gate high voltage line VGHL and the gate low voltage line VGLL may extend in the first direction (X-axis direction). The gate high voltage line VGHL and the gate low voltage line VGLL may be located between the pad part PAD and the first or second resistance line R1 or R2. The gate high voltage line VGHL and the gate low voltage line VGLL may be located between the pad part PAD and the antistatic circuits ESD. The gate high voltage line VGHL and the gate low voltage line VGLL may be located between the pad part PAD and the first fan-out line FOL1. The gate high voltage line VGHL and the gate low voltage line VGLL may be formed of the same material as the first and second connection electrodes CCE1 and CCE2 at the same layer as the first and second connection electrodes CCE1 and CCE2, but are not limited thereto.

Figure 6:
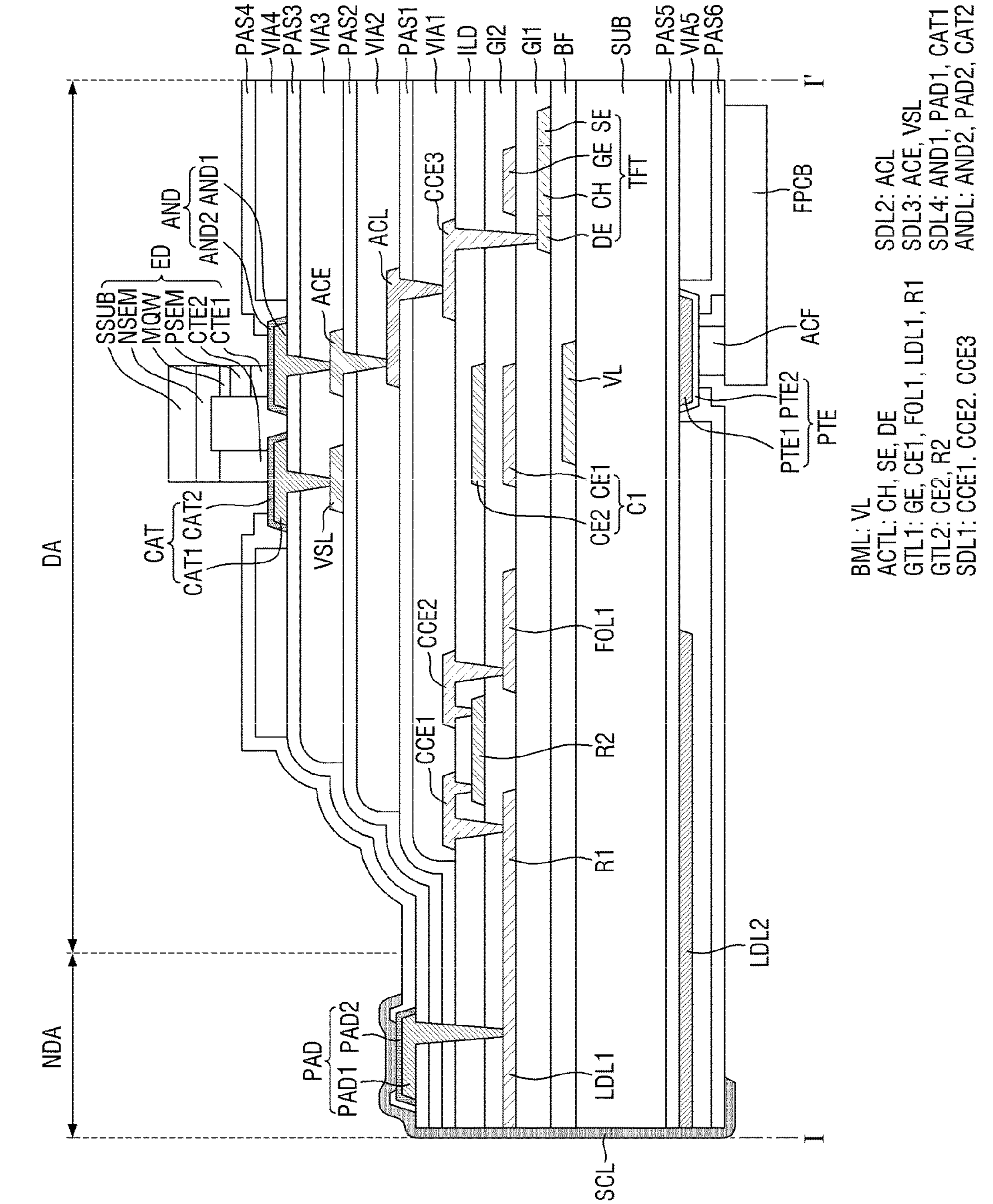
FIG. 6 is a cross-sectional view of an example taken along the line I-I' of FIG. 2.

FIG. 6 is a cross-sectional view of an example taken along the line I-I' of FIG. 2.

Referring to FIG. 6, the display device 10 may include a substrate SUB, a light-blocking layer BML, a buffer layer BF, an active layer ACTL, a first gate insulating film GI1, a first gate layer GTL1, a second gate insulating film GI2, a second gate layer GTL2, an interlayer insulating film ILD, a first source metal layer SDL1, a first via layer VIA1, a first passivation layer PAS1, a second source metal layer SDL2, a second via layer VIA2, a second passivation layer PAS2, a third source metal layer SDL3, a third via layer VIA3, a third passivation layer PAS3, a fourth source metal layer SDL4, an anode layer ANDL, a fourth via layer VIA4, a fourth passivation layer PAS4, a fifth passivation layer PAS5, a film contact electrode PTE, a second lead line LDL2, a side connection line SCL, a fifth via layer VIA5, a sixth passivation layer PAS6, and a flexible film FPCB.

The substrate SUB may support the display device 10. The substrate SUB may be a base substrate or a base member. The substrate SUB may be a flexible substrate that may be bent, folded, and rolled. As an example, the substrate SUB may include an insulating material, such as a polymer resin, for example, polyimide PI, but is not limited thereto. As another example, the substrate SUB may be a rigid substrate including a glass material.

The light-blocking layer BML may be located on the substrate SUB. The light-blocking layer BML may block light incident on a thin film transistor TFT or a pixel electrode AND. The light-blocking layer BML may include a voltage line VL. The light-blocking layer BML may include at least one of molybdenum (Mo), aluminum (Al), chromium (Cr), gold (Au), titanium (Ti), nickel (Ni), neodymium (Nd), and copper (Cu).

The buffer layer BF may be located on the substrate SUB. The buffer layer BF may include an inorganic material capable of reducing or preventing permeation of air or moisture. The buffer layer BF may include a plurality of inorganic films that are alternately stacked. For example, the buffer layer BF may be a multiple film in which one or more inorganic films of a silicon nitride layer, a silicon oxynitride layer, a silicon oxide layer, a titanium oxide layer, and an aluminum oxide layer are alternately stacked.

The active layer ACTL may be located on the buffer layer BF. The active layer ACTL may include a channel CH, a source electrode SE, and a drain electrode DE of the thin film transistor TFT. Here, the thin film transistor TFT may be a transistor of a pixel circuit. The source electrode SE and the drain electrode DE may be made into conductors by heat-treating the active layer ACTL. As an example, the active layer ACTL may include polycrystalline silicon, single crystal silicon, low-temperature polycrystalline silicon, amorphous silicon, or an oxide semiconductor. As another example, the active layer ACTL may include first and second active layers located at different layers. In this case, the first active layer may include polycrystalline silicon, single crystal silicon, low-temperature polycrystalline silicon, or amorphous silicon, and the second active layer may include an oxide semiconductor. The first gate insulating film Gl1 may be located on the active layer ACTL.

The first gate insulating film GI1 may insulate the gate electrode GE and the channel CH of the thin film transistor TFT from each other. The first gate insulating film Gl1 may include an inorganic film. For example, the first gate insulating film Gl1 may include one of a silicon nitride layer, a silicon oxynitride layer, a silicon oxide layer, a titanium oxide layer, and an aluminum oxide layer.

The first gate layer GTL1 may be located on the first gate insulating film Gl1. The first gate layer GTL1 may include the first lead line LDL1, the first resistance line R1, the first fan-out line FOL1, a gate electrode GE of the thin film transistor TFT, and a first capacitor electrode CE1 of a first capacitor C1. The first gate layer GTL1 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The first lead line LDL1 may be electrically connected to the flexible film FPCB through the side connection line SCL located on a side surface of the display device 10 and to the second lead line LDL2 located on a lower portion of the display device 10. The first lead line LDL1 may supply a voltage or a signal received from the flexible film FPCB to the first fan-out line FOL1.

The first resistance line R1 may be electrically connected to the second resistance line R2 through the first connection electrode CCE1. The first resistance line R1 may be connected to the pad part PAD penetrating through the first to third passivation layers PAS1, PAS2, and PAS3, the interlayer insulating film ILD, and the second gate insulating film GI2. A length of the first resistance line R1 may be designed differently depending on a position of the first fan-out line FOL1. In the case a length of the first fan-out line FOL1 is relatively great, the length of the first resistance line R1 may be relatively small. In the case a length of the first fan-out line FOL1 is relatively small, the length of the first resistance line R1 may be relatively great. For example, lengths of the first fan-out line FOL1 and the first resistance line R1 or the second resistance line R2 may be inversely proportional The sum of the lengths of respective ones of the first and second resistance lines R1 and R2 and the first fan-out line FOL1 may be substantially the same regardless of the position of the first fan-out line FOL1.

The first fan-out line FOL1 may be electrically connected to the second resistance line R2 through the second connection electrode CCE2. The first fan-out line FOL1 is located in the display area DA, and thus, a size of the non-display area NDA may be decreased. The first fan-out line FOL1 may be electrically connected to a data line, a clock line, or a power line located in the display area DA. The first fan-out line FOL1 may supply the voltage or the signal received from the flexible film FPCB to the data line, the clock line, or the power line.

The second gate insulating film GI2 may be located on the first gate layer GTL1. The second gate insulating film GI2 may insulate the first gate layer GTL1 and the second gate layer GTL2 from each other. The second gate insulating film GI2 may include an inorganic film. For example, the second gate insulating film GI2 may include one of a silicon nitride layer, a silicon oxynitride layer, a silicon oxide layer, a titanium oxide layer, and an aluminum oxide layer.

The second gate layer GTL2 may be located on the second gate insulating film GI2. The second gate layer GTL2 may include the second resistance line R2 and a second capacitor electrode CE2 of the first capacitor C1. The second gate layer GTL2 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The second resistance line R2 may be connected between the first resistance line R1 and the first fan-out line FOL1. The second resistance line R2 may be electrically connected to the first resistance line R1 through the first connection electrode CCE1. The second resistance line R2 may be electrically connected to the first fan-out line FOL1 through the second connection electrode CCE2. A length of the second resistance line R2 may be designed differently depending on a position of the first fan-out line FOL1. In the case a length of the first fan-out line FOL1 is relatively great, the length of the second resistance line R2 may be relatively small. In the case a length of the first fan-out line FOL1 is relatively small, the length of the second resistance line R2 may be relatively great. The sum of the lengths of respective ones of the first and second resistance lines R1 and R2 and the first fan-out line FOL1 may be substantially the same regardless of the position of the first fan-out line FOL1.

At least a portion of the second resistance line R2 may overlap the antistatic circuit ESD. The first electrode, the second electrode, and a channel of the antistatic circuit ESD may be located at the active layer ACTL, and the gate electrode of the antistatic circuit ESD may be located at the first gate layer GTL1. Accordingly, at least a portion of the second resistance line R2 overlaps the antistatic circuit ESD, and thus, an arrangement area or a design area of the second resistance line R2 may be decreased.

The interlayer insulating film ILD may be located on the second gate layer GTL2. The interlayer insulating film ILD may insulate the first source metal layer SDL1 and the second gate layer GTL2 from each other. The interlayer insulating film ILD may include an inorganic film. For example, the interlayer insulating film ILD may include one of a silicon nitride layer, a silicon oxynitride layer, a silicon oxide layer, a titanium oxide layer, and an aluminum oxide layer.

The first source metal layer SDL1 may be located on the interlayer insulating film ILD. The first source metal layer SDL1 may include first to third connection electrodes CCE1, CCE2, and CCE3. The third connection electrode CCE3 may be connected to an anode connection line ACL penetrating through the first passivation layer PAS1 and the first via layer VIA1. The third connection electrode CCE3 may penetrate through the interlayer insulating film ILD, the second gate insulating film GI2, and the first gate insulating film GI1, and may be connected to the drain electrode DE of the thin film transistor TFT. Accordingly, the third connection electrode CCE3 may electrically connect the anode connection line ACL and the drain electrode DE to each other. The first source metal layer SDL1 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The first via layer VIA1 may be located on the first source metal layer SDL1. The first via layer VIA1 may planarize an upper end of the first source metal layer SDL1. The first via layer VIA1 may include an organic film made of an acrylic resin, an epoxy resin, a phenolic resin, a polyamide resin, a polyimide resin, or the like.

The first passivation layer PAS1 may be located on the first via layer VIA1 to protect the first source metal layer SDL1. The first passivation layer PAS1 may include an inorganic film. For example, the first passivation layer PAS1 may include one of a silicon nitride layer, a silicon oxynitride layer, a silicon oxide layer, a titanium oxide layer, and an aluminum oxide layer.

The second source metal layer SDL2 may be located on the first via layer VIA1. The second source metal layer SDL2 may include the anode connection line ACL. The anode connection line ACL may be connected to an anode connection electrode ACE penetrating through the second passivation layer PAS2 and the second via layer VIA2. The anode connection line ACL may penetrate through the first passivation layer PAS1 and the first via layer VIA1 and may be connected to the third connection electrode CCE3. Accordingly, the anode connection line ACL may electrically connect the anode connection electrode ACE and the third connection electrode CCE3 to each other. The second source metal layer SDL2 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The second via layer VIA2 may be located on the second source metal layer SDL2. The second via layer VIA2 may planarize an upper end of the second source metal layer SDL2. The second via layer VIA2 may include an organic film made of an acrylic resin, an epoxy resin, a phenolic resin, a polyamide resin, a polyimide resin, or the like.

The second passivation layer PAS2 may be located on the second via layer VIA2 to protect the second source metal layer SDL2. The second passivation layer PAS2 may include an inorganic film. For example, the second passivation layer PAS2 may include one of a silicon nitride layer, a silicon oxynitride layer, a silicon oxide layer, a titanium oxide layer, and an aluminum oxide layer.

The third source metal layer SDL3 may be located on the second via layer VIA2. The third source metal layer SDL3 may include the anode connection electrode ACE and a low potential line VSL. The anode connection electrode ACE may be connected to a first pixel electrode AND1 penetrating through the third passivation layer PAS3 and the third via layer VIA3. The anode connection electrode ACE may penetrate through the second passivation layer PAS2 and the second via layer VIA2 and may be connected to the anode connection line ACL. Accordingly, the anode connection electrode ACE may electrically connect the first pixel electrode AND1 and the anode connection line ACL to each other. The third source metal layer SDL3 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The low potential line VSL may receive a low potential voltage or a common voltage. The low potential line VSL may be connected to a first cathode electrode CAT1 penetrating through the third passivation layer PAS3 and the third via layer VIA3.

The third via layer VIA3 may be located on the third source metal layer SDL3. The third via layer VIA3 may planarize an upper end of the third source metal layer SDL3. The third via layer VIA3 may include an organic film made of an acrylic resin, an epoxy resin, a phenolic resin, a polyamide resin, a polyimide resin, or the like.

The third passivation layer PAS3 may be located on the third via layer VIA3 to protect the third source metal layer SDL3. The third passivation layer PAS3 may include an inorganic film. For example, the third passivation layer PAS3 may include one of a silicon nitride layer, a silicon oxynitride layer, a silicon oxide layer, a titanium oxide layer, and an aluminum oxide layer.

The fourth source metal layer SDL4 may be located on the third passivation layer PAS3. The fourth source metal layer SDL4 may include the first pixel electrode AND1 and the first cathode electrode CAT1. The first pixel electrode AND1 may penetrate through the third passivation layer PAS3 and the third via layer VIA3, and may be connected to the anode connection electrode ACE. The first cathode electrode CAT1 may penetrate through the third passivation layer PAS3 and the third via layer VIA3, and may be connected to the low potential line VSL. The fourth source metal layer SDL4 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The anode layer ANDL may be located on the fourth source metal layer SDL4. The anode layer ANDL may include a second pixel electrode AND2 and a second cathode electrode CAT2. The anode layer ANDL may include a transparent conductive material (TCO), such as indium tin oxide (ITO), indium zinc oxide (IZO), or indium tin zinc oxide (ITZO).

The pad part PAD may be located on the third passivation layer PAS3 in the non-display area NDA. The pad part PAD may be connected between the first lead line LDL1 and the first resistance line R1. The pad part PAD may be electrically connected to the flexible film FPCB through the first lead line LDL1, the side connection line SCL, and the second lead line LDL2. The pad part PAD may include a first pad electrode PAD1 and a second pad electrode PAD2. The first pad electrode PAD1 may be formed of the same material as the first pixel electrode AND1 and the first cathode electrode CAT1 in the same process as the first pixel electrode AND1 and the first cathode electrode CAT1. The first pad electrode PAD1 may penetrate through the first to third passivation layers PAS1, PAS2, and PAS3, the interlayer insulating film ILD, and the second gate insulating film GI2 and may be connected to the first resistance line R1. The second pad electrode PAD2 may be located on the first pad electrode PAD1. The second pad electrode PAD2 may be formed of the same material as the second pixel electrode AND2 and the second cathode electrode CAT2 in the same process as the second pixel electrode AND2 and the second cathode electrode CAT2.

The fourth via layer VIA4 may be located on the third passivation layer PAS3 on which the pixel electrode AND and a cathode electrode CAT are not formed. The fourth via layer VIA4 may planarize an upper end of the third passivation layer PAS3.

The fourth passivation layer PAS4 may be located on the fourth via layer VIA4, an edge of the pixel electrode AND, an edge of the cathode electrode CAT, and an edge of the pad part PAD. The fourth passivation layer PAS4 may include an inorganic film. For example, the fourth passivation layer PAS4 may include one of a silicon nitride layer, a silicon oxynitride layer, a silicon oxide layer, a titanium oxide layer, and an aluminum oxide layer. The fourth passivation layer PAS4 does not cover and may expose a portion of an upper surface of the pixel electrode AND. The fourth passivation layer PAS4 does not cover and may expose a portion of an upper surface of the pad part PAD.

The pixel electrode AND may receive a driving current from a pixel circuit, and a light emitting element ED may emit light having luminance (e.g., predetermined luminance) based on a magnitude of the driving current and a period in which the driving current flows.

The light emitting element ED may be connected between the pixel electrode AND and the cathode electrode CAT. The light emitting element ED may be located on the anode layer ANDL. The light emitting element ED may be a flip chip-type micro light emitting diode in which the first contact electrode CTE1 is connected to the pixel electrode AND and the second contact electrode CTE2 is connected to the cathode electrode CAT, but is not limited thereto. The light emitting element ED may include an inorganic material, such as GaN. Each of lengths of the light emitting element ED in the first direction (X-axis direction), the second direction (Y-axis direction), and the third direction (Z-axis direction) may be several to several hundreds of micrometers. For example, each of the lengths of the light emitting element ED in the first direction (X-axis direction), the second direction (Y-axis direction), and the third direction (Z-axis direction) may be about 100 μm or less.

The light emitting element ED may be grown and formed on a semiconductor substrate, such as a silicon wafer. As an example, a plurality of light emitting elements ED may be moved onto the pixel electrode AND and the cathode electrode CAT of the substrate SUB on the silicon wafer. As another example, a plurality of light emitting elements ED may be moved onto the pixel electrode AND and the cathode electrode CAT through an electrostatic method that uses an electrostatic head or a stamp method that uses an elastic polymer material, such as polydimethylsiloxane (PDMS) or silicon as a transfer substrate.

The light emitting element ED may be a light-emitting structure including a base substrate SSUB, an n-type semiconductor NSEM, an active layer MQW, a p-type semiconductor PSEM, the first contact electrode CTE1, and the second contact electrode CTE2. For example, the base substrate SSUB may be a sapphire substrate, but is not limited thereto.

The n-type semiconductor NSEM may be located on one surface of the base substrate SSUB. For example, the n-type semiconductor NSEM may be located on a lower surface of the base substrate SSUB. The n-type semiconductor NSEM may include GaN doped with an n-type dopant, such as Si, Ge, or Sn.

The active layer MQW may be located on a portion of one surface of the n-type semiconductor NSEM. The active layer MQW may include a material having a single or multiple quantum well structure. When the active layer MQW includes the material having the multiple quantum well structure, the active layer MQW may have a structure in which a plurality of well layers and barrier layers are alternately stacked. As an example, the well layer may include InGaN, and the barrier layer may include GaN or AlGaN, but the present disclosure is not limited thereto. As another example, the active layer MQW may have a structure in which semiconductor materials having large band gap energy and semiconductor materials having small band gap energy are alternately stacked. As another example, the active layer MQW may include other Group III to Group V semiconductor materials depending on a wavelength band of emitted light.

The p-type semiconductor PSEM may be located on one surface of the active layer MQW. The p-type semiconductor PSEM may include GaN doped with a p-type conductivity-type dopant, such as Mg, Zn, Ca, Se, or Ba.

The first contact electrode CTE1 may be located on one surface of the p-type semiconductor PSEM, and the second contact electrode CTE2 may be located on another portion of one surface of the n-type semiconductor NSEM. The second contact electrode CTE2 may be spaced apart from the active layer MQW.

The first contact electrode CTE1 and the pixel electrode AND may be adhered to each other through a conductive adhesive member, such as an anisotropic conductive film or an anisotropic conductive paste. As another example, the first contact electrode CTE1 and the pixel electrode AND may be adhered to each other through a soldering process. The second contact electrode CTE2 and the cathode electrode CAT may be adhered to each other through a conductive adhesive member or a soldering process.

The fifth passivation layer PAS5 may be located on a lower surface of the substrate SUB to planarize the lower surface of the substrate SUB. The fifth passivation layer PAS5 may include an inorganic film. For example, the fifth passivation layer PAS5 may include one of a silicon nitride layer, a silicon oxynitride layer, a silicon oxide layer, a titanium oxide layer, and an aluminum oxide layer.

The film contact electrode PTE may be located on one surface or a lower surface of the fifth passivation layer PAS5. The film contact electrode PTE may supply a voltage or a signal received from the flexible film FPCB to the side connection line SCL through the second lead line LDL2. The film contact electrode PTE may be electrically connected to the flexible film FPCB through a connection film ACF.

The film contact electrode PTE may include a first film contact electrode PTE1 and a second film contact electrode PTE2. The first film contact electrode PTE1 may be located on one surface or the lower surface of the fifth passivation layer PAS5. The first film contact electrode PTE1 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof. The second film contact electrode PTE2 may be located on one surface or a lower surface of the first film contact electrode PTE1. The second film contact electrode PTE2 may include a transparent conductive material (TCO), such as indium tin oxide (ITO), indium zinc oxide (IZO), or indium tin zinc oxide (ITZO).

The second lead line LDL2 may be located on one surface, or the lower surface, of the fifth passivation layer PAS5. The second lead line LDL2 may extend from the flexible film FPCB located in the display area DA to an edge of the non-display area NDA. The second lead line LDL2 may be formed of the same material as the first film contact electrode PTE1, and may be at the same layer as the first film contact electrode PTE1. The second lead line LDL2 may supply the voltage or the signal received from the film contact electrode PTE to the side connection line SCL.

The side connection line SCL may be located on the side surface of the display device 10. The side connection line SCL may cover a region near an edge of a lower surface of the display device 10, the side surface of the display device 10, and a region near an edge of an upper surface of the display device 10. One end of the side connection line SCL may be connected to a side surface of the second lead line LDL2, and the other end of the side connection line SCL may be connected to a side surface of the first lead line LDL1. The side connection line SCL may cover the pad part PAD. The side connection line SCL may electrically connect the second lead line LDL2 and the first lead line LDL1 to each other. The side connection line SCL may pass by side surfaces of the fifth via layer VIA5, the fifth passivation layer PAS5, the substrate SUB, the buffer layer BF, the first and second gate insulating films GI1 and GI2, the interlayer insulating film ILD, and the first to third passivation layers PAS1, PAS2, and PAS3.

The fifth via layer VIA5 may cover the second lead line LDL2, and may expose a lower surface of the film contact electrode PTE. The fifth via layer VIA5 may planarize a lower end of the substrate SUB. The fifth via layer VIA5 may include an organic film made of an acrylic resin, an epoxy resin, a phenolic resin, a polyamide resin, a polyimide resin, or the like.

The sixth passivation layer PAS6 may be located on one surface or a lower surface of the fifth via layer VIA5 to protect the film contact electrode PTE and the second lead line LDL2. The sixth passivation layer PAS6 may include an inorganic film. For example, the sixth passivation layer PAS6 may include one of a silicon nitride layer, a silicon oxynitride layer, a silicon oxide layer, a titanium oxide layer, and an aluminum oxide layer.

The flexible film FPCB may be located on one surface, or a lower surface, of the sixth passivation layer PAS6. The flexible film FPCB may be attached to the lower surface of the sixth passivation layer PAS6 using an adhesive member, in one or more embodiments. One side of the flexible film FPCB may supply a voltage or a signal to the first lead line LDL1 and the first fan-out line FOL1 located above the substrate SUB through the film contact electrode PTE, through the second lead line LDL2, and through the side connection line SCL. The flexible film FPCB may mount the display driver DIC thereon below the substrate SUB. The flexible film FPCB may transmit signals of the display driver DIC to the unit pixels UP.

The connection film ACF may attach the flexible film FPCB to the lower surface of the film contact electrode PTE. For example, the connection film ACF may include an anisotropic conductive film. When the connection film ACF includes the anisotropic conductive film, the connection film ACF may have conductivity in areas with which the film contact electrode PTE and the flexible film FPCB are in contact, and may electrically connect the flexible film FPCB to the film contact electrode PTE.

The display device 10 includes the flexible film FPCB located below the substrate SUB, the first fan-out line FOL1 located above the substrate SUB, and the side connection line SCL electrically connecting the flexible film FPCB and the first fan-out line FOL1 to each other, and thus, may reduce or minimize an area of the non-display area NDA.

Figure 7:
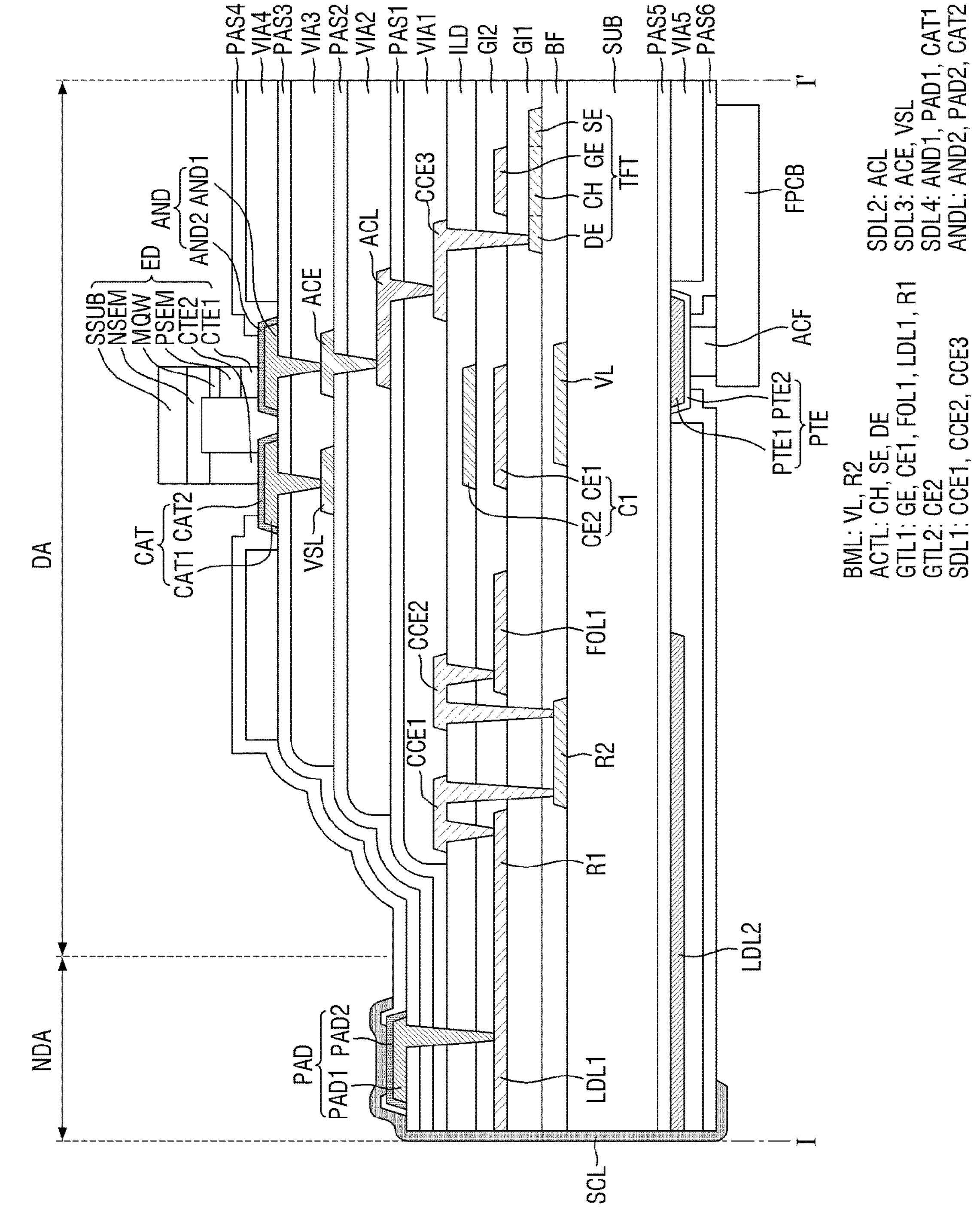
FIG. 7 is a cross-sectional view of another example taken along the line I-I' of FIG. 2.

FIG. 7 is a cross-sectional view of another example taken along the line I-I' of FIG. 2. A display device of FIG. 7 is different in a configuration of the second resistance line R2 from the display device of FIG. 6, and the same configurations as the configurations described above will be briefly described or a description thereof will be omitted.

Referring to FIG. 7, the light-blocking layer BML may be located on the substrate SUB. The light-blocking layer BML may block light incident on the thin film transistor TFT or the pixel electrode AND. The light-blocking layer BML may include the voltage line VL and the second resistance line R2. The light-blocking layer BML may include at least one of molybdenum (Mo), aluminum (Al), chromium (Cr), gold (Au), titanium (Ti), nickel (Ni), neodymium (Nd), and copper (Cu).

The second resistance line R2 may be connected between the first resistance line R1 and the first fan-out line FOL1. The second resistance line R2 may be electrically connected to the first resistance line R1 through the first connection electrode CCE1. The second resistance line R2 may be electrically connected to the first fan-out line FOL1 through the second connection electrode CCE2. A length of the second resistance line R2 may be designed differently depending on a position of the first fan-out line FOL1. In the case a length of the first fan-out line FOL1 is relatively great, the length of the second resistance line R2 may be relatively small. In the case a length of the first fan-out line FOL1 is relatively small, the length of the second resistance line R2 may be relatively great. The sum of the lengths of respective ones of the first and second resistance lines R1 and R2 and the first fan-out line FOL1 may be substantially the same regardless of the position of the first fan-out line FOL1.

At least a portion of the second resistance line R2 may overlap the antistatic circuit ESD. The first electrode, the second electrode, and a channel of the antistatic circuit ESD may be located at the active layer ACTL, and the gate electrode of the antistatic circuit ESD may be located at the first gate layer GTL1. Accordingly, at least a portion of the second resistance line R2 overlaps the antistatic circuit ESD, and thus, an arrangement area or a design area of the second resistance line R2 may be decreased.

The first gate layer GTL1 may be located on the first gate insulating film GI1. The first gate layer GTL1 may include the first lead line LDL1, the first resistance line R1, the first fan-out line FOL1, a gate electrode GE of the thin film transistor TFT, and a first capacitor electrode CE1 of a first capacitor C1. The first gate layer GTL1 may be a single layer or a multi-layer made of any one of molybdenum (Mo), aluminum (Al), chromium (Cr), gold (Au), titanium (Ti), nickel (Ni), neodymium (Nd), and copper (Cu), or alloys thereof.

The first resistance line R1 may be electrically connected to the second resistance line R2 through the first connection electrode CCE1. The first resistance line R1 may be connected to the pad part PAD penetrating through the first to third passivation layers PAS1, PAS2, and PAS3, the interlayer insulating film ILD, and the second gate insulating film GI2. A length of the first resistance line R1 may be designed differently depending on a position of the first fan-out line FOL1. In the case a length of the first fan-out line FOL1 is relatively great, the length of the first resistance line R1 may be relatively small. In the case a length of the first fan-out line FOL1 is relatively small, the length of the first resistance line R1 may be relatively great. The sum of the lengths of respective ones of the first and second resistance lines R1 and R2 and the first fan-out line FOL1 may be substantially the same regardless of the position of the first fan-out line FOL1.

The first fan-out line FOL1 may be electrically connected to the second resistance line R2 through the second connection electrode CCE2. The first fan-out line FOL1 is located in the display area DA, and thus, a size of the non-display area NDA may be decreased. The first fan-out line FOL1 may be electrically connected to a data line, a clock line, or a power line located in the display area DA. The first fan-out line FOL1 may supply the voltage or the signal received from the flexible film FPCB to the data line, the clock line, or the power line.

Figure 8:
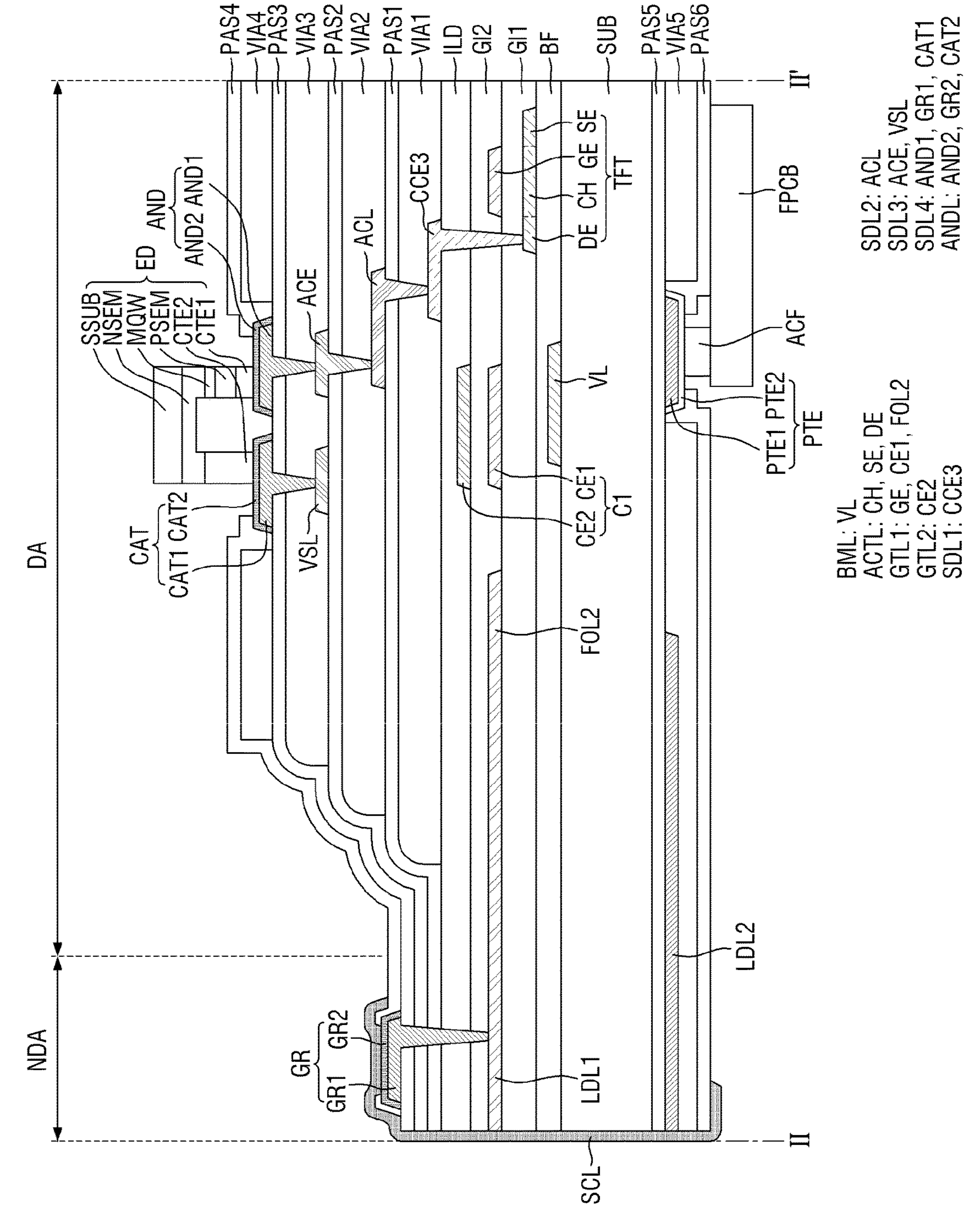
FIG. 8 is a cross-sectional view taken along the line II-II' of FIG. 2.

FIG. 8 is a cross-sectional view taken along the line II-II' of FIG. 2.

Referring to FIG. 8, the display device 10 may include the second fan-out line FOL2, the first lead line LDL1, the antistatic layer GR, the side connection line SCL, and the second lead line LDL2.

The second fan-out line FOL2 may be connected to the antistatic layer GR penetrating through the first to third passivation layers PAS1, PAS2, and PAS3, the interlayer insulating film ILD, and the second gate insulating film GI2. The second fan-out line FOL2 extends from the non-display area NDA to the display area DA, and thus, a size of the non-display area NDA may be decreased. The second fan-out line FOL2 may be electrically connected to the low potential line VSL or the common voltage line located in the display area DA. The second fan-out line FOL2 may supply a low potential voltage or a common voltage received from the flexible film FPCB to the low potential line or the common voltage line. The low potential line VSL or the common voltage line may be located at one or more of the first to third source metal layers SDL1, SDL2, and SDL3, but is not limited thereto. The second fan-out line FOL2 may effectively discharge static electricity introduced through the antistatic layer GR in a cutting process or a grinding process through the low potential line VSL or the common voltage line.

The first lead line LDL1 may be electrically connected to the flexible film FPCB through the side connection line SCL located on a side surface of the display device 10 and the second lead line LDL2 located on a lower portion of the display device 10. The first lead line LDL1 may supply a voltage or a signal received from the flexible film FPCB to the second fan-out line FOL2.

The antistatic layer GR may be located at an edge of an upper surface of the display device 10 or an edge of an upper portion of the substrate SUB to surround the display area DA. The antistatic layer GR may include a first antistatic layer GR1 and a second antistatic layer GR2. The first antistatic layer GR1 may be located at the fourth source metal layer SDL4. The first antistatic layer GR1 may be formed of the same material as the first pixel electrode AND1 and the first cathode electrode CAT1 in the same process as the first pixel electrode AND1 and the first cathode electrode CAT1. The first antistatic layer GR1 may penetrate through the first to third passivation layers PAS1, PAS2, and PAS3, the interlayer insulating film ILD, and the second gate insulating film GI2 and may be connected to the second fan-out line FOL2. The second antistatic layer GR2 may be located on the first antistatic layer GR1. The second antistatic layer GR2 may be located at the anode layer ANDL. The second antistatic layer GR2 may be formed of the same material as the second pixel electrode AND2 and the second cathode electrode CAT2 in the same process as the second pixel electrode AND2 and the second cathode electrode CAT2. An edge of the second antistatic layer GR2 may be covered by the fourth passivation layer PAS4, but an upper surface of the second antistatic layer GR2 may be exposed without being covered by the fourth passivation layer PAS4.

The antistatic layer GR may be a guard ring capable of reducing or preventing static electricity, but is not limited thereto. The antistatic layer GR may be electrically connected to the low potential line VSL or the common voltage line to rapidly discharge static electricity. The antistatic layer GR may be located at the edge of the upper surface of the display device 10 and may substantially eliminate static electricity introduced in a cutting process or a grinding process of the display device 10 to reduce or prevent the likelihood of static electricity being introduced into the display area DA. The antistatic layer GR may rapidly discharge static electricity introduced from the outside of the display device 10.

As an example, the antistatic layer GR may include a transparent conductive material (TCO), such as indium tin oxide (ITO), indium zinc oxide (IZO), or indium tin zinc oxide (ITZO). As another example, the antistatic layer GR may have a stacked structure, such as ITO/Ag/ITO/, ITO/Ag/IZO, or ITO/Ag/ITZO/IZO. As still another example, the antistatic layer GR may include at least one of molybdenum (Mo), aluminum (Al), chromium (Cr), gold (Au), titanium (Ti), nickel (Ni), neodymium (Nd), and copper (Cu).

The side connection line SCL may be located on the side surface of the display device 10. The side connection line SCL may cover a region near an edge of a lower surface of the display device 10, the side surface of the display device 10, and a region near an edge of an upper surface of the display device 10. One end of the side connection line SCL may be connected to a side surface of the second lead line LDL2, and the other end of the side connection line SCL may be connected to a side surface of the first lead line LDL1. The side connection line SCL may cover the antistatic layer GR (e.g., in plan view). The side connection line SCL may electrically connect the second lead line LDL2 and the first lead line LDL1 to each other. The side connection line SCL may pass by side surfaces of the fifth via layer VIA5, the fifth passivation layer PAS5, the substrate SUB, the buffer layer BF, the first and second gate insulating films GI1 and GI2, the interlayer insulating film ILD, and the first to third passivation layers PAS1, PAS2, and PAS3.

The second lead line LDL2 may be located on one surface or the lower surface of the fifth passivation layer PAS5. The second lead line LDL2 may extend from the flexible film FPCB located in the display area DA to an edge of the non-display area NDA. The second lead line LDL2 may be formed of the same material as the first film contact electrode PTE1 at the same layer as the first film contact electrode PTE1. The second lead line LDL2 may supply the voltage or the signal received from the film contact electrode PTE to the side connection line SCL.

Accordingly, in the display device 10, the flexible film FPCB and the display driver DIC are located on the lower surface of the display device 10, such that the non-display area NDA may be reduced or minimized, and a pixel pitch between adjacent display devices 10 (e.g., between respective pixels of different display devices 10) may be designed to be the same as a pixel pitch within the display device 10. The display device 10 includes the antistatic layers GR, and may thus eliminate static electricity introduced from the outside of the display device 10 to reduce or prevent damage to a thin film transistor layer and a light-emitting-element layer.

Figure 9:
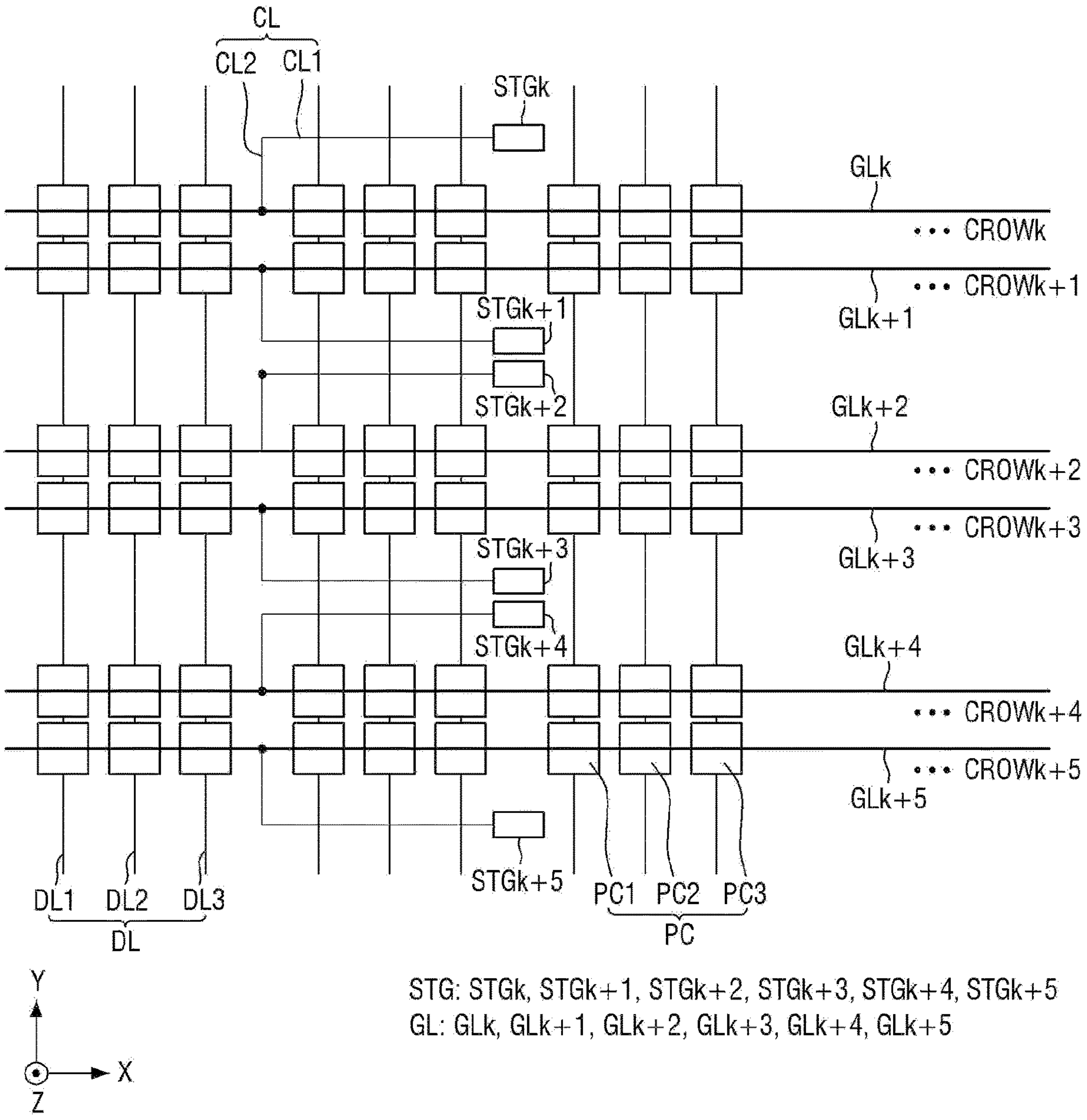
FIG. 9 is a view illustrating a connection relationship between a stage and a gate line in the display device according to one or more embodiments.

FIG. 9 is a view illustrating a connection relationship between a stage and a gate line in the display device according to one or more embodiments.

Referring to FIG. 9, the display area DA may include a pixel circuit PC, a stage STG, and a gate line GL.

The pixel circuit PC may be connected to a data line DL and the gate line GL. The pixel circuit PC may include first to third pixel circuits PC1, PC2, and PC3. The first pixel circuit PC1 may receive a data voltage from a first data line DL1 and may supply a driving current to the first pixel SP1. The second pixel circuit PC2 may receive a data voltage from a second data line DL2 and may supply a driving current to the second pixel SP2. The third pixel circuit PC3 may receive a data voltage from a third data line DL3 and may supply a driving current to the third pixel SP3. A plurality of pixel circuits PC may be arranged along a plurality of circuit rows.

The stage STG may be located in the display area DA. The stage STG may receive a clock signal from a clock line located in the display area DA, and may receive a source voltage from a power line located in the display area DA. For example, the stage STG may receive at least one of a driving voltage, a low potential voltage, an initialization voltage, a reference voltage, a gate high voltage, and a gate low voltage, but is not limited thereto. The stage STG may generate a gate signal and may supply the gate signal to the gate line GL. The stage STG may include k-th to k+5-th stages STGk, STGk+1, STGk+2, STGk+3, STGk+4, and STGk+5 (here, k is a positive integer).

The k-th stage STGk may be located above a k-th circuit row CROWk. The k-th stage STGk may supply a gate signal to a k-th gate line GLk connected to pixel circuits PC of the k-th circuit row CROWk. The k-th stage STGk may be connected to the k-th gate line GLk through a connection line CL. The k-th stage STGk may be connected to the k-th gate line GLk through a first connection line CL1 extending in the first direction (X-axis direction) and a second connection line CL2 extending in the second direction (Y-axis direction).

The k+1-th stage STGk+1 and the k+2-th stage STGk+2 may be located between a k+1-th circuit row CROWk+1 and a k+2-th circuit row CROWk+2. The k+1-th stage STGk+1 may be located below the k+1-th circuit row CROWk+1. The k+1-th stage STGk+1 may supply a gate signal to a k+1-th gate line GLk+1 connected to pixel circuits PC of the k+1-th circuit row CROWk+1. The k+1-th stage STGk+1 may be connected to the k+1-th gate line GLk+1 through a connection line CL.

The k+2-th stage STGk+2 may be located above the k+2-th circuit row CROWk+2. The k+2-th stage STGk+2 may supply a gate signal to a k+2-th gate line GLk+2 connected to pixel circuits PC of the k+2-th circuit row CROWk+2. The k+2-th stage STGk+2 may be connected to the k+2-th gate line GLk+2 through a connection line CL.

The k+3-th stage STGk+3 and the k+4-th stage STGk+4 may be located between a k+3-th circuit row CROWk+3 and a k+4-th circuit row CROWk+4. The k+3-th stage STGk+3 may be located below the k+3-th circuit row CROWk+3. The k+3-th stage STGk+3 may supply a gate signal to a k+3-th gate line GLk+3 connected to pixel circuits PC of the k+3-th circuit row CROWk+3. The k+3-th stage STGk+3 may be connected to the k+3-th gate line GLk+3 through a connection line CL.

The k+4-th stage STGk+4 may be located above the k+4-th circuit row CROWk+4. The k+4-th stage STGk+4 may supply a gate signal to a k+4-th gate line GLK+4 connected to pixel circuits PC of the k+4-th circuit row CROWk+4. The k+4-th stage STGk+4 may be connected to the k+4-th gate line GLk+4 through a connection line CL.

The k+5-th stage STGk+5 may be located below a k+5-th circuit row CROWk+5. The k+5-th stage STGk+5 may supply a gate signal to a k+5-th gate line GLk+5 connected to pixel circuits PC of the k+5-th circuit row CROWk+5. The k+5-th stage STGk+5 may be connected to the k+5-th gate line GLk+5 through a connection line CL.

Figure 10:
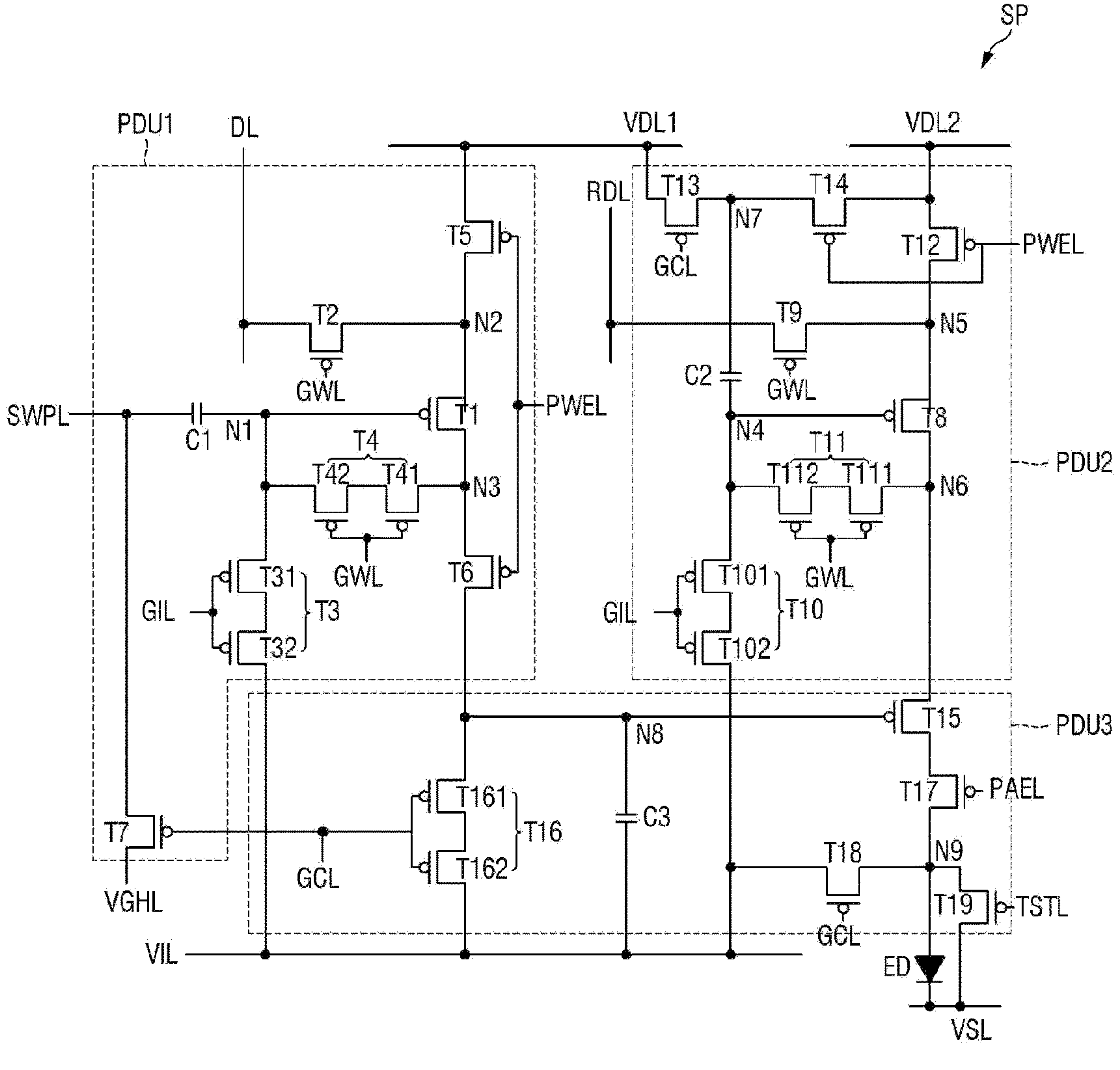
FIG. 10 is a circuit diagram illustrating a pixel circuit of the display device according to one or more embodiments.

FIG. 10 is a circuit diagram illustrating a pixel circuit of the display device according to one or more embodiments.

Referring to FIG. 10, the pixel SP may include a pixel circuit PC and a light emitting element ED. The pixel circuit PC may include a first pixel-driving unit PDU1, a second pixel-driving unit PDU2, and a third pixel-driving unit PDU3. The first pixel-driving unit PDU1 may include first to seventh transistors T1 to T7 and a first capacitor C1.

The first transistor T1 may control a control current supplied to an eighth node N8 of the third pixel-driving unit PDU3 based on a voltage of a first node N1, which is a gate electrode of the first transistor T1.

The second transistor T2 may be turned on based on a scan write signal of a scan write line GWL to supply a data voltage received from a data line DL to a second node N2, which is a first electrode of the first transistor T1.

The third transistor T3 may be turned on based on a scan initialization signal of a scan initialization line GIL to discharge the first node N1 to an initialization voltage. For example, the third transistor T3 may include a third-first transistor T31 and a third-second transistor T32 connected to each other in series.

The fourth transistor T4 may be turned on based on the scan write signal of the scan write line GWL to electrically connect the first node N1, which is the gate electrode of the first transistor T1, and a third node N3, which is a second electrode of the first transistor T1, to each other. For example, the fourth transistor T4 may include a fourth-first transistor T41 and a fourth-second transistor T42 connected to each other in series.

The fifth transistor T5 may be turned on based on a pulse width modulation (PWM) emission signal of a PWM emission line PWEL to electrically connect a first power line VDL1 and the second node N2 to each other.

The sixth transistor T6 may be turned on based on the PWM emission signal of the PWM emission line PWEL to electrically connect the third node N3 and the eighth node N8 of the third pixel-driving unit PDU3 to each other.

The seventh transistor T7 may be turned on based on a scan control signal of a scan control line GCL to supply a gate high voltage VGH of the gate high voltage line VGHL to a second capacitor electrode of the first capacitor C1 connected to a sweep line SWPL.

The first capacitor C1 may be connected between the first node N1 and the sweep line SWPL.

The second pixel-driving unit PDU2 may include eighth to fourteenth transistors T8 to T14 and a second capacitor C2.

The eighth transistor T8 may control a driving current flowing to the light emitting element ED based on a voltage of a fourth node N4, which is a gate electrode of the eighth transistor T8.

The ninth transistor T9 may be turned on based on the scan write signal of the scan write line GWL to supply a first pulse amplitude modulation (PAM) data voltage of a first PAM data line RDL to a fifth node N5, which is a first electrode of the eighth transistor T8.

The tenth transistor T10 may be turned on based on the scan initialization signal of the scan initialization line GIL to discharge the fourth node N4 to an initialization voltage. For example, the tenth transistor T10 may include a tenth-first transistor T101 and a tenth-second transistor T102 connected to each other in series.

The eleventh transistor T11 may be turned on based on the scan write signal of the scan write line GWL to electrically connect the fourth node N4, which is the gate electrode of the eighth transistor T8, and a sixth node N6, which is a second electrode of the eighth transistor T8, to each other. For example, the eleventh transistor T11 may include an eleventh-first transistor T111 and an eleventh-second transistor T112 connected to each other in series.

The twelfth transistor T12 may be turned on based on the PWM emission signal of the PWM emission line PWEL to electrically connect a second power line VDL2 and the fifth node N5 to each other.

The thirteenth transistor T13 may be turned on based on the scan control signal of the scan control line GCL to electrically connect the first power line VDL1 and a seventh node N7, which is a second electrode of the second capacitor C2, to each other.

The fourteenth transistor T14 may be turned on based on the PWM emission signal of the PWM emission line PWEL to electrically connect the second power line VDL2 and the seventh node N7 to each other.

The second capacitor C2 may be connected between the fourth node N4 and the seventh node N7.

The third pixel-driving unit PDU3 may include fifteenth to nineteenth transistors T15 to T19 and a third capacitor C3.

The fifteenth transistor T15 may control a period in which the driving current flows based on the control current received in the eighth node N8, which is a gate electrode of the fifteenth transistor T15.

The sixteenth transistor T16 may be turned on based on the scan control signal of the scan control line GCL to discharge the eighth node N8 to an initialization voltage. For example, the sixteenth transistor T16 may include a sixteenth-first transistor T161 and a sixteenth-second transistor T162 connected to each other in series.

The seventeenth transistor T17 may be turned on based on a PAM emission signal of a PAM emission line PAEL to electrically connect a second electrode of the fifteenth transistor T15 and a ninth node N9, which is a first electrode of the light emitting element ED, to each other.

The eighteenth transistor T18 may be turned on based on the scan control signal of the scan control line GCL to discharge the ninth node N9 to an initialization voltage.

The nineteenth transistor T19 may be turned on based on a test signal of a test signal line TSTL to electrically connect the ninth node N9 and a low potential line VSL to each other.

The third capacitor C3 may be connected between the eighth node N8 and an initialization voltage line VIL.

The light emitting element ED may be connected between the ninth node N9 and the low potential line VSL. The ninth node N9 may be electrically connected to the pixel electrode AND of FIG. 6.

For example, one of the first and second electrodes of each of the first to nineteenth transistors T1 to T19 may be a source electrode, and the other of the first and second electrodes of each of the first to nineteenth transistors T1 to T19 may be a drain electrode. Each of the first to nineteenth transistors T1 to T19 may be implemented as a P-type metal oxide semiconductor field effect transistor (MOSFET), but is not limited thereto. As another example, at least one of the first to nineteenth transistors T1 to T19 may be implemented as an N-type MOSFET.

The pixel SP of FIG. 10 may correspond to the first pixel SP1 connected to the first PAM data line RDL. The second and third pixels SP2 and SP3 may have substantially the same circuit structure as the pixel SP1 except that the second pixel SP2 is connected to a second PAM data line and the third pixel SP3 is connected to a third PAM data line.

Figure 11:
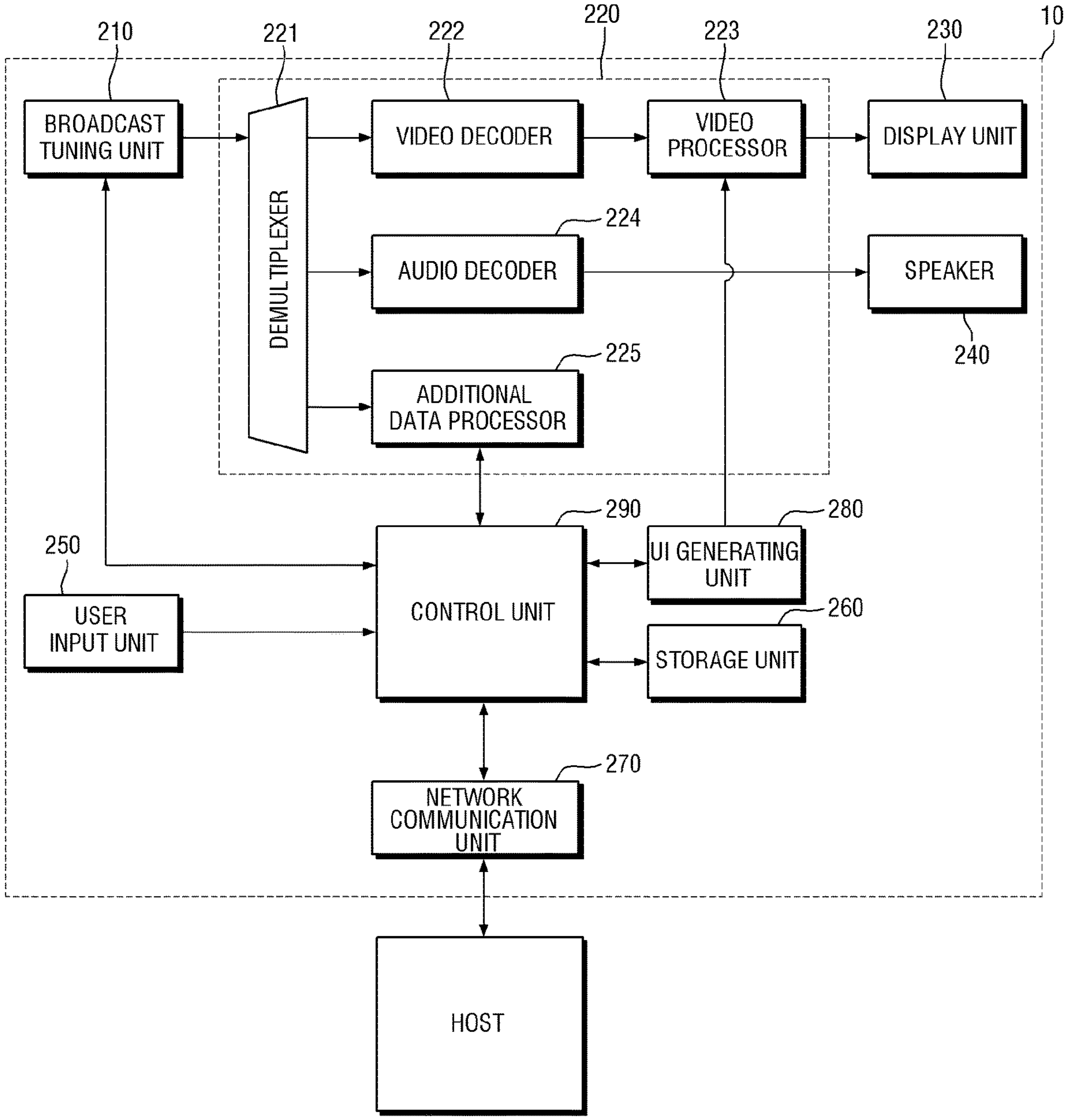
FIG. 11 is a block diagram illustrating a display system of the display device according to one or more embodiments.

FIG. 11 is a block diagram illustrating a display system of the display device according to one or more embodiments.

Referring to FIG. 11, the tiled display device TD may include a host system HOST and a plurality of display devices 10.

The host system HOST may be implemented as any one of a television system, a home theater system, a set-top box, a navigation system, a digital versatile disk (DVD) player, a Blu-ray player, a personal computer (PC), a mobile phone system, and a tablet PC.

The host system HOST may receive user's commands in various formats. As an example, the host system HOST may receive a command by a user's touch input. As another example, the host system HOST may receive a user's command by a keyboard input or a button input of a remote controller.

Referring to FIG. 11 in conjunction with FIG. 1, the host system HOST may receive original video data corresponding to an original image from the outside. The host system HOST may divide the original video data by the number of display devices. For example, the host system HOST may divide the original video data into first video data corresponding to the first display device 10-1, second video data corresponding to the second display device 10-2, third video data corresponding to the third display device 10-3, and fourth video data corresponding to the fourth display device 10-4, so as to correspond to each of the first to fourth display devices 10-1 to 10-4 shown in FIG. 1. The host system HOST may transmit the first video data to the first display device 10-1, may transmit the second video data to the second display device 10-2, may transmit the third video data to the third display device 10-3, and may transmit the fourth video data to the fourth display device 10-4.

The first display device 10-1 may display a first image based on the first video data, the second display device 10-2 may display a second image based on the second video data, the third display device 10-3 may display a third image based on the third video data, and the fourth display device 10-4 may display a fourth image based on the fourth video data. Accordingly, the user may view the original image in which the first to fourth images displayed on the first to fourth display devices 10-1, 10-2, 10-3, and 10-4 are combined with each other.

The display device 10 may include a broadcast tuning unit 210, a signal processing unit 220, a display unit 230, a speaker 240, a user input unit 250, a storage unit 260, a network communication unit 270, a user interface (UI) generating unit 280, and a control unit 290.

The broadcast tuning unit 210 may receive a broadcast signal of a corresponding channel through an antenna by tuning a channel frequency based on a control signal of the control unit 290. The broadcast tuning unit 210 may include a channel detection module and a radio frequency (RF) module. The channel detection module may tune the channel frequency, and the RF module may demodulate the received broadcast signal.

The signal processing unit 220 may process the broadcast signal demodulated by the broadcast tuning unit 210, and may output the processed broadcast signal to the display unit 230 and the speaker 240. The signal processing unit 220 may include a demultiplexer 221, a video decoder 222, a video processor 223, an audio decoder 224, and an additional data processor 225.

The demultiplexer 221 may separate the demodulated broadcast signal into a video signal, an audio signal, and additional data. Each of the separated video signal, audio signal, and additional data may be reconstructed by the video decoder 222, the audio decoder 224, or the additional data processor 225. The video decoder 222, the audio decoder 224, and the additional data processor 225 may reconstruct the separated video signal, audio signal, and additional data to a decoding format corresponding to an encoding format at the time of transmitting the broadcast signal.

The video processor 223 may convert a decoded video signal to be suitable for a vertical frequency, resolution, an aspect ratio, and the like, conforming to an output standard of the display unit 230, and the speaker 240 may receive a decoded audio signal and output a sound.

The display unit 230 may include a display panel on which an image is displayed and a display driver DIC driving the display panel.

The user input unit 250 may receive a signal from the host system HOST. The user input unit 250 may receive data related to communication between other display devices 10 as well as data related to a selection of a channel and a selection and a manipulation of a user interface (UI) menu from the host system HOST.

The storage unit 260 may store various software programs including an operating system (OS) program, recorded broadcast programs, moving pictures, photographs, and other data. For example, the storage unit 260 may include a storage medium, such as a hard disk or non-volatile memory.

The network communication unit 270 may perform short-distance communication between the host system HOST and other display devices 10. For example, the network communication unit 270 may include a communication module including an antenna pattern capable of implementing mobile communication, data communication, Bluetooth, RF, Ethernet, and the like.

The network communication unit 270 may transmit and receive wireless signals with at least one of a base station, an external terminal, and a server on a mobile communication network constructed according to technical standards or communication methods for mobile communication (e.g., global system for mobile communication (GSM), code division multiple access (CDMA), CDMA2000™, enhanced voice-data optimized or enhanced voice-data Only (EV-DO), wideband CDMA (WCDMA), high speed downlink packet access (HSDPA), high speed uplink packet access (HSUPA), long term evolution (LTE), LTE-Advanced (LTE-A), 5G, etc.) through an antenna pattern.

The network communication unit 270 may transmit and receive wireless signals on a communication network according to wireless Internet technologies through the antenna pattern. For example, the wireless Internet technology may be wireless local area network (WLAN), wireless-fidelity (Wi-Fi™), Wi-Fi Direct™, digital living network alliance (DLNA™), wireless broadband (WiBro), world interoperability for microwave access (WiMAX™), high speed downlink packet access (HSDPA), high speed uplink packet access (HSUPA), long term evolution (LTE), or LTE-Advanced (LTE-A), and the antenna pattern may transmit and receive data according to at least one wireless Internet technology within a range including Internet technologies that are not mentioned above.

The UI generation unit 280, which generates a UI menu for communication between the host system HOST and other display devices 10, may be implemented by an algorithm code and an on screen display integrated chip (OSD IC). The UI menu for communication with the host system HOST and other display devices 10 may be a menu for designating a counterpart digital television (TV) with which communication is desired and selecting a desired function.

The control unit 290 may be in charge of overall control of the display device 10, and may be in charge of communication control with the host system HOST and other display devices 10. The control unit 290 may store a corresponding algorithm code for control, and may be implemented by a microcontroller unit (MCU) in which the stored algorithm code is executed.

The control unit 290 may perform control to transmit a corresponding control command and data to the host system HOST and other display devices 10 through the network communication unit 270 according to an input and a selection of the user input unit 250. The control unit 290 may receive a control command (e.g., predetermined control command) and data from the host system HOST and other display devices 10 and perform an operation according to the control command.

In concluding the detailed description, those skilled in the art will appreciate that many variations and modifications can be made to the embodiments without substantially departing from the aspects of the present disclosure. Therefore, the disclosed embodiments of the present disclosure are used in a generic and descriptive sense only and not for purposes of limitation.

What is claimed is:

1. A display device comprising:

a substrate comprising a display area comprising pixels, and a non-display area around the display area;

a pad part in the non-display area;

antistatic circuits between the pad part and the pixels, respectively;

a first resistance line connected to the pad part and to the antistatic circuits;

a second resistance line connected to the first resistance line and overlapping the first resistance line in a thickness direction of the substrate at multiple points at which the first resistance line and the second resistance line cross in plan view; and a fan-out line connected between the second resistance line and a respective one of the pixels.

2. The display device of claim 1, wherein at least a portion of the second resistance line overlaps a respective one of the antistatic circuits.

3. The display device of claim 1, wherein the first resistance line extends while being bent multiple times between the antistatic circuits.

4. The display device of claim 3, wherein the second resistance line extends while being bent multiple times between the antistatic circuits, and wherein the second resistance line crosses the first resistance line in plan view.

5. The display device of claim 1, wherein the fan-out line overlaps a respective one of the pixels at one edge of the display area.

6. The display device of claim 1, further comprising a gate high voltage line and a gate low voltage line extending in a first direction, and located between the pad part and the second resistance line.

7. The display device of claim 6, wherein the gate high voltage line and the gate low voltage line are between the pad part and the antistatic circuits.

8. The display device of claim 6, wherein some of the antistatic circuits are connected between the gate high voltage line and the first resistance line, and wherein others of the antistatic circuits are connected between the first resistance line and the gate low voltage line.

9. The display device of claim 1, wherein a length of the fan-out line is inversely proportional to a length of a corresponding one of the first or second resistance line.

10. The display device of claim 1, wherein each of the pixels comprises a first capacitor comprising a first capacitor electrode at a first gate layer and a second capacitor electrode at a second gate layer above the first gate layer, wherein the first resistance line is at the first gate layer, and wherein the second resistance line is at the second gate layer.

11. The display device of claim 10, wherein each of the pixels comprises a thin film transistor comprising a channel at an active layer, and a gate electrode at the first gate layer above the active layer, wherein the first resistance line is at a same layer as the first capacitor electrode, and wherein the second resistance line is at a layer below the active layer.

12. The display device of claim 1, further comprising:

a flexible film below the substrate and overlapping the display area;

a first lead line extending from the pad part to an edge of the substrate;

a side connection line connected to the first lead line and on a side surface of the substrate; and a second lead line below the substrate and connected between the side connection line and the flexible film.

13. The display device of claim 12, further comprising:

a low potential line in the display area on the substrate; and antistatic layers on an edge of an upper surface of the substrate, and electrically connected to the low potential line.

14. The display device of claim 13, wherein the first lead line and the pad part are between the antistatic layers.

15. A display device comprising:

a substrate comprising a display area comprising pixels, and a non-display area around the display area;

a pad part in the non-display area;

antistatic circuits at an active layer above the substrate;

a first gate layer above the active layer;

a first resistance line at the first gate layer, and connected to the pad part and the antistatic circuits;

a second resistance line connected to the first resistance line, and at a second gate layer above the first gate layer to overlap the first resistance line; and a fan-out line at the first gate layer and connected to the second resistance line.

16. The display device of claim 15, further comprising a connection electrode above a source metal layer above the second gate layer, and having a first end connected to the first resistance line, and a second end connected to the second resistance line.

17. The display device of claim 16, wherein the connection electrode is connected to a first electrode or a second electrode of a respective one of the antistatic circuits.

18. The display device of claim 15, wherein the first resistance line is bent multiple times between the antistatic circuits.

19. The display device of claim 18, wherein the second resistance line is bent multiple times between the antistatic circuits, and crosses the first resistance line in plan view.

20. A tiled display device comprising:

display devices each comprising:

a substrate comprising a display area comprising pixels for displaying an image, and a non-display area around the display area;

a pad part in the non-display area;

antistatic circuits between the pad part and the pixels;

a first resistance line connected to the pad part and the antistatic circuits;

a second resistance line connected to the first resistance line and overlapping the first resistance line in a thickness direction of the substrate at multiple points at which the first resistance line and the second resistance line cross in plan view; and a fan-out line connected between the second resistance line and the pixels; and a coupling area between the display devices.

* * * * *